(12) United States Patent
Aritome

(10) Patent No.: US 9,070,446 B1
(45) Date of Patent: Jun. 30, 2015

(54) SEMICONDUCTOR DEVICE

(71) Applicant: SK hynix Inc., Icheon-si Gyeonggi-do (KR)

(72) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/228,434

(22) Filed: Mar. 28, 2014

(30) Foreign Application Priority Data

Dec. 27, 2013 (KR) .................. 10-2013-0165326

(51) Int. Cl.
| | | |
|---|---|---|
| G11C 16/04 | (2006.01) | |
| G11C 5/06 | (2006.01) | |
| G11C 5/02 | (2006.01) | |
| H01L 27/115 | (2006.01) | |
| H01L 21/768 | (2006.01) | |
| H01L 29/788 | (2006.01) | |
| H01L 29/792 | (2006.01) | |
| H01L 29/786 | (2006.01) | |

(52) U.S. Cl.
CPC ......... *G11C 16/0483* (2013.01); *H01L 29/7926* (2013.01); *G11C 5/02* (2013.01); *G11C 5/025* (2013.01); *G11C 2213/71* (2013.01); *H01L 29/7889* (2013.01); *H01L 29/78642* (2013.01); *H01L 27/11524* (2013.01); *G11C 5/06* (2013.01)

(58) Field of Classification Search
CPC .. G11C 16/0483; G11C 5/06; G11C 2213/71; G11C 5/02; G11C 5/025; H01L 27/11524; H01L 29/7926; H01L 29/78642; H01L 29/7889
USPC ............................ 365/185.05, 185.17, 51, 63
See application file for complete search history.

(56) References Cited

U.S. PATENT DOCUMENTS

| | | | |
|---|---|---|---|
| 2002/0028541 A1* | 3/2002 | Lee et al. ....................... | 438/149 |
| 2002/0081782 A1* | 6/2002 | Cleeves ........................ | 438/131 |

FOREIGN PATENT DOCUMENTS

| | | |
|---|---|---|
| KR | 1020040086858 A | 10/2004 |
| KR | 1020100052597 A | 5/2010 |

* cited by examiner

*Primary Examiner* — Ly D Pham
(74) *Attorney, Agent, or Firm* — William Park & Associates Ltd.

(57) ABSTRACT

A semiconductor device includes first memory strings coupled between a first common source line formed on a substrate and bit lines formed over the first common source line, and second memory strings coupled between the bit lines and a second common source line formed over the bit lines, wherein each of the bit lines includes a stacked structure of a conductive layer and a silicon layer formed on the conductive layer.

22 Claims, 18 Drawing Sheets

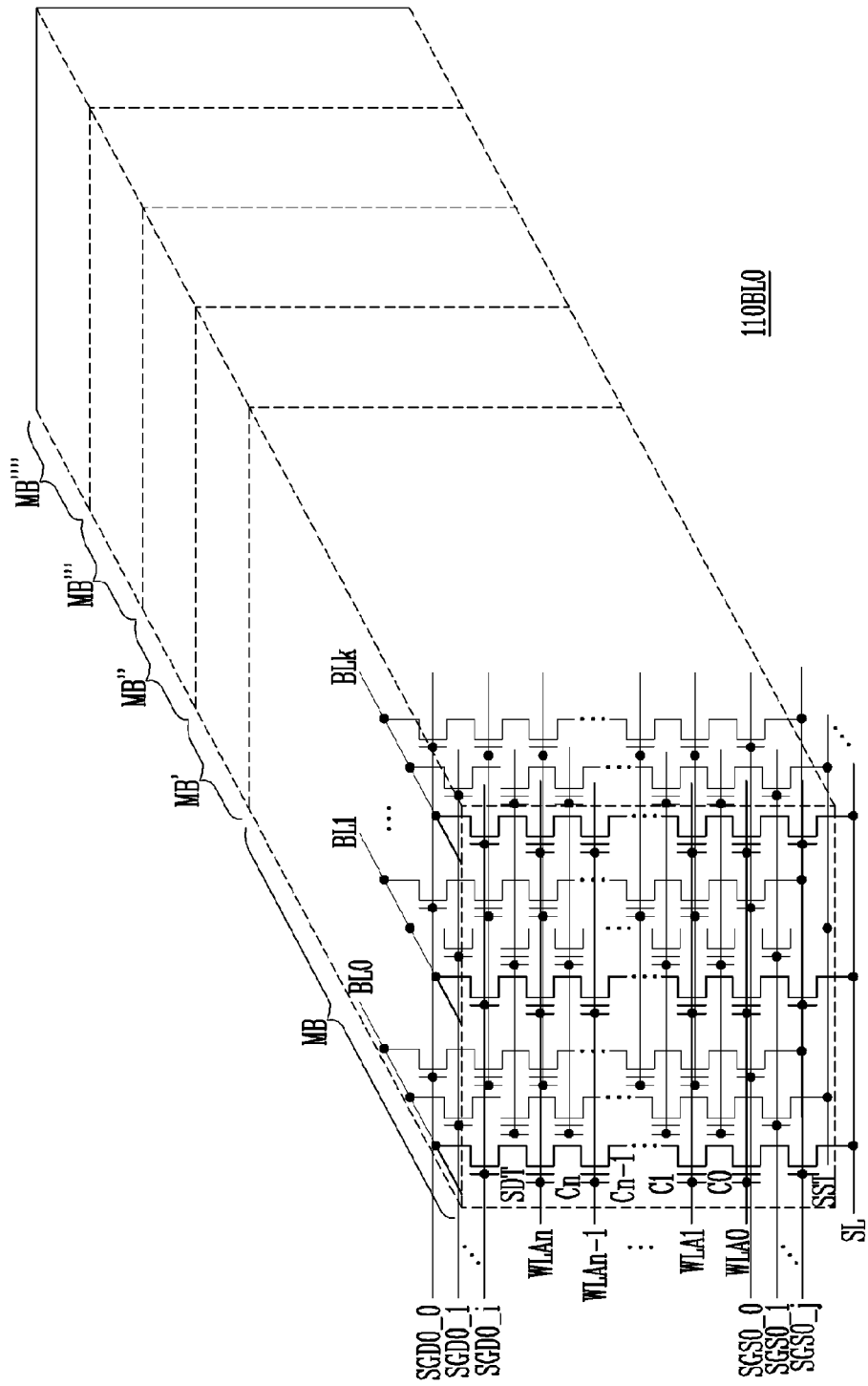

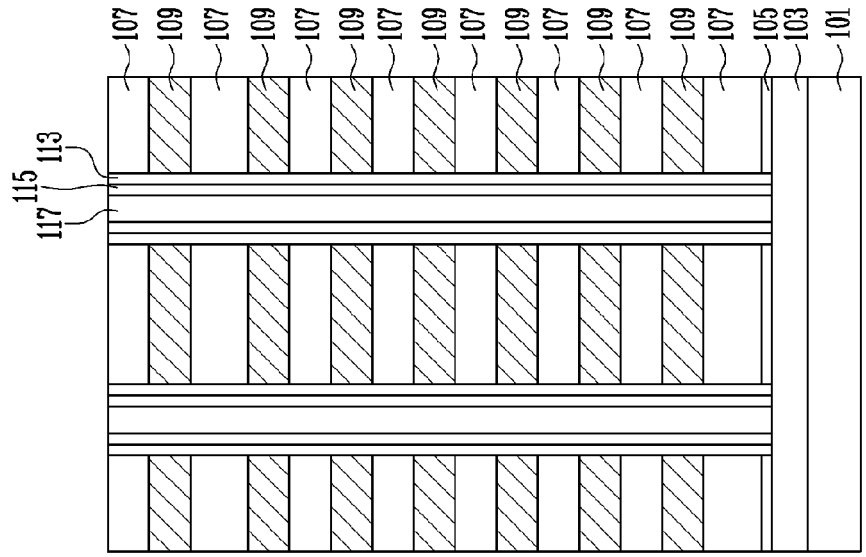
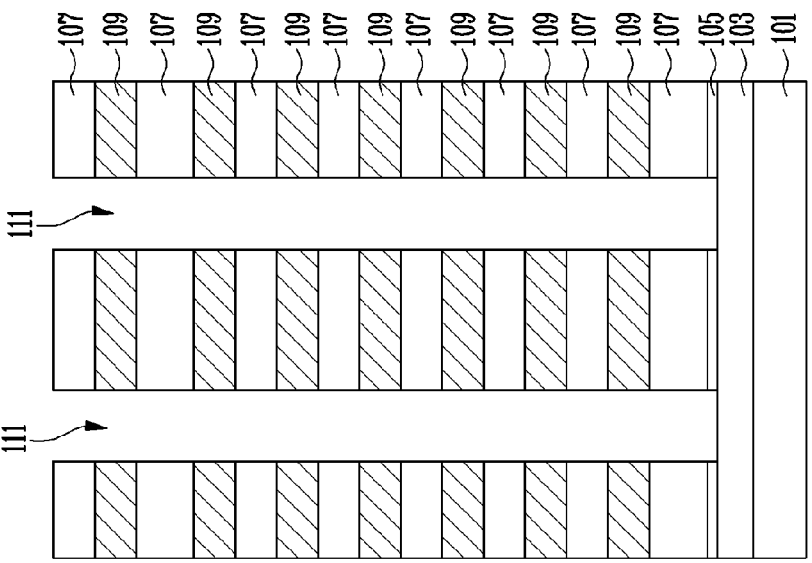

US 9,070,446 B1

SEMICONDUCTOR DEVICE

CROSS-REFERENCE TO RELATED APPLICATION

The present application claims priority to Korean patent application number 10-2013-0165326 filed on Dec. 27, 2013, in the Korean Intellectual Property Office, the entire disclosure of which is incorporated by reference herein.

BACKGROUND

1. Technical Field

Various embodiments relate generally to a semiconductor device and, more particularly, to a semiconductor device including a three-dimensional memory array and a method of operating the same.

2. Related Art

One possible way to increase data storage capacity is to provide a larger number of memory cells within a predetermined area. The number of memory cells may be increased by reducing memory cell size, but there are limitations in memory cell size reduction. Another method for increasing the number of memory cells is to provide a three-dimensional (3D) structured memory block (or memory string) where memory cells are stacked in a direction vertical to a semiconductor substrate. This 3D structured memory string may include a vertical channel layer formed of silicon. The vertical channel layer may be formed between a bit line and a common source line that are formed at different heights.

Recently, a method of forming more three-dimensional memory blocks within a predetermined area has been in demand, and a method of preventing deterioration of electrical characteristics caused thereby has also been in demand.

BRIEF SUMMARY

A semiconductor device according to an embodiment may include first memory strings coupled between first bit lines formed on a substrate and a common source line formed over the first bit lines, and second memory strings coupled between the common source line and second bit lines formed over the common source line, wherein the common source line includes a stacked structure of a conductive layer and a silicon layer formed on the conductive layer.

A semiconductor device according to an embodiment may include first memory strings coupled between first bit lines formed on a substrate and a common source line formed over the first bit lines, and second memory strings coupled between the common source line and second bit lines formed over the common source line, wherein the common source line includes a stacked structure of a conductive layer and a silicon layer formed on the conductive layer.

A computing system according to an embodiment may include a memory system including a memory controller, the memory system and memory controller including a processor; and a memory device configured to receive data from the controller, the memory device including: first memory strings coupled between a first common source line formed on a substrate and bit lines formed over the first common source line; and second memory strings coupled between the bit lines and a second common source line formed over the bit lines, wherein each of the bit lines includes a stacked structure of a conductive layer and a silicon layer formed over the conductive layer.

BRIEF DESCRIPTION OF THE DRAWINGS

FIGS. 4A and 4B are views illustrating the memory array shown in FIG. 1;

FIGS. 5 to 15 are cross-sectional views illustrating a method of manufacturing a semiconductor device according to an embodiment;

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
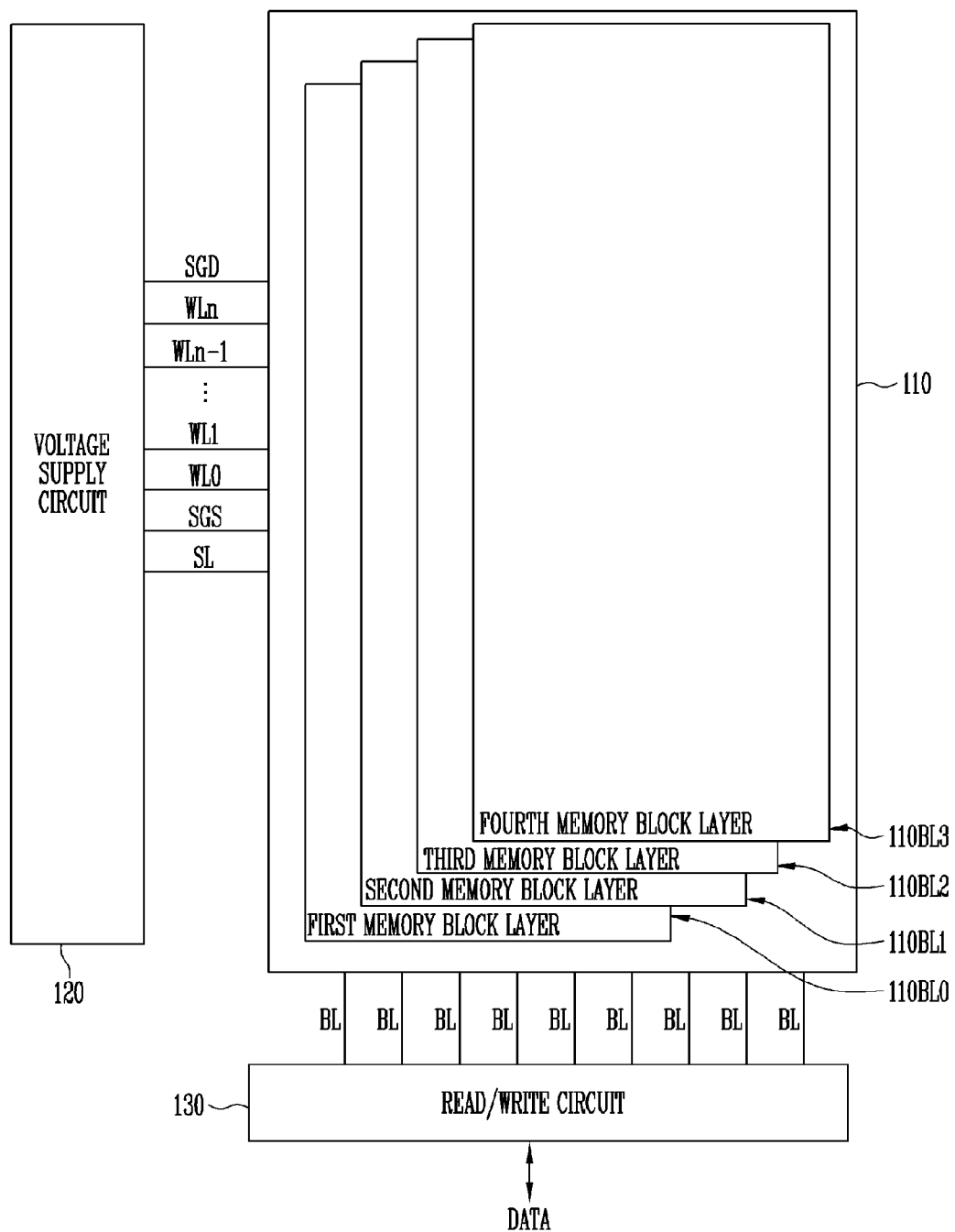
FIG. 1 is a block diagram illustrating a semiconductor memory device according to an embodiment.

FIG. 1 is a block diagram illustrating a semiconductor memory device according to an embodiment.

Referring to FIG. 1, a semiconductor memory device may include a memory array 110 and operation circuits 120 and 130. The operation circuits may include a voltage supply circuit 120 and a read/write circuit 130.

The memory array 110 may include memory block layers 110BL0 to 110BL3 that are stacked over a substrate. Each of the memory block layers may include memory blocks that are arranged in a horizontal direction. These memory blocks may be arranged in one direction (e.g., bit line BL direction). Each of the memory blocks may include memory strings that are coupled in a vertical direction between bit lines and a common source line. A structure of the memory string is described in detail below.

Figure 2:
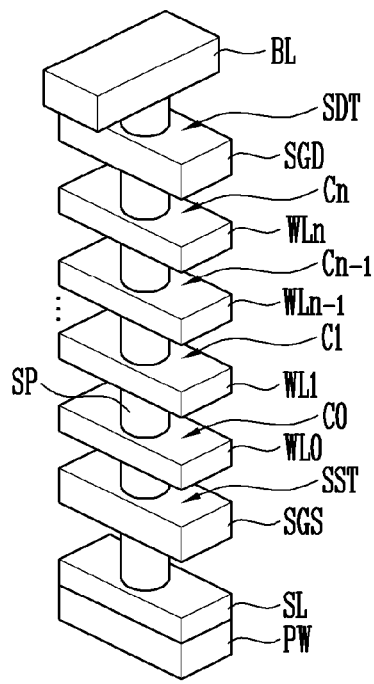
FIG. 2 is a three-dimensional view illustrating a memory string included in a memory array shown in FIG. 1.
Figure 3:
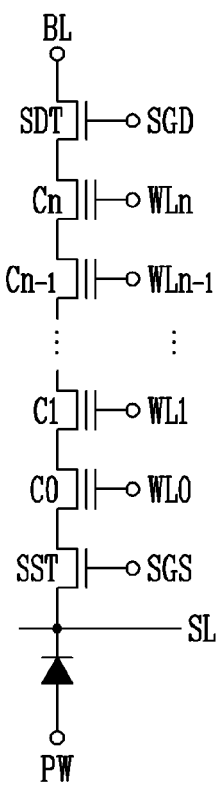
FIG. 3 is a circuit diagram illustrating a memory string included in the memory array shown in FIG. 1.

FIG. 2 is a three-dimensional view illustrating the memory string included in the memory array shown in FIG. 1. FIG. 3 is a circuit diagram illustrating the memory string included in the memory array shown in FIG. 1.

Referring to FIGS. 2 and 3, the common source line SL may be formed over a semiconductor substrate in which a P well PW is formed. A vertical channel layer SP may be formed on the common source line SL. An upper portion of the vertical channel layer SP may be coupled to a bit line BL. The vertical channel layer SP may include polysilicon. A plurality of conductive layers SGS, WL0 to WLn, and SGD may be formed to surround the vertical channel layer SP at different heights. A multilayer (not illustrated) including a charge storage layer may be formed on a surface of the vertical channel layer SP. The multilayer may also be located between the vertical channel layer SP and the conductive layers SGS, WL0 to WLn and SGD.

A lowermost conductive layer of the plurality of conductive layers may be a source selection line (or first selection line) SGS, and an uppermost conductive layer thereof may be a drain selection line (or second selection line) SGD. The conductive layers between the source and drain selection lines SGS and SGD may be word lines WL0 to WLn. In other words, the conductive layers SGS, WL0 to WLn, and SGD may be formed in a plurality of layers over the semiconductor substrate, and the vertical channel layer SP passing through the conductive layers SGS, WL0 to WLn, and SGD may be connected in the vertical direction between the bit line BL and the source line SL formed on the semiconductor substrate.

A drain selection transistor (or second selection transistor) SDT may be formed at a position where the uppermost conductive layer SGD surrounds the vertical channel layer SP. A source selection transistor (or first selection transistor) SST may be formed at a position where the lowermost conductive layer SGS surrounds the vertical channel layer SP. Memory cells C0 to Cn may be formed at positions where the intermediate conductive layers WL0 to WLn surround the vertical channel layer SP.

The memory string configured as described above may include the source selection transistor SST, the memory cells C0 to Cn and the drain selection transistor SDT that are vertically connected to the substrate between the common source line SL and the bit line BL. The source selection transistor SST may electrically connect the memory cells C0 to Cn to the common source line SL in response to a first selection signal that is applied to the first selection line SGS. The drain selection transistor SDT may electrically connect the memory cells C0 to Cn to the bit line BL in response to a second selection signal that is applied to the second selection line SGD.

Figure 4B:
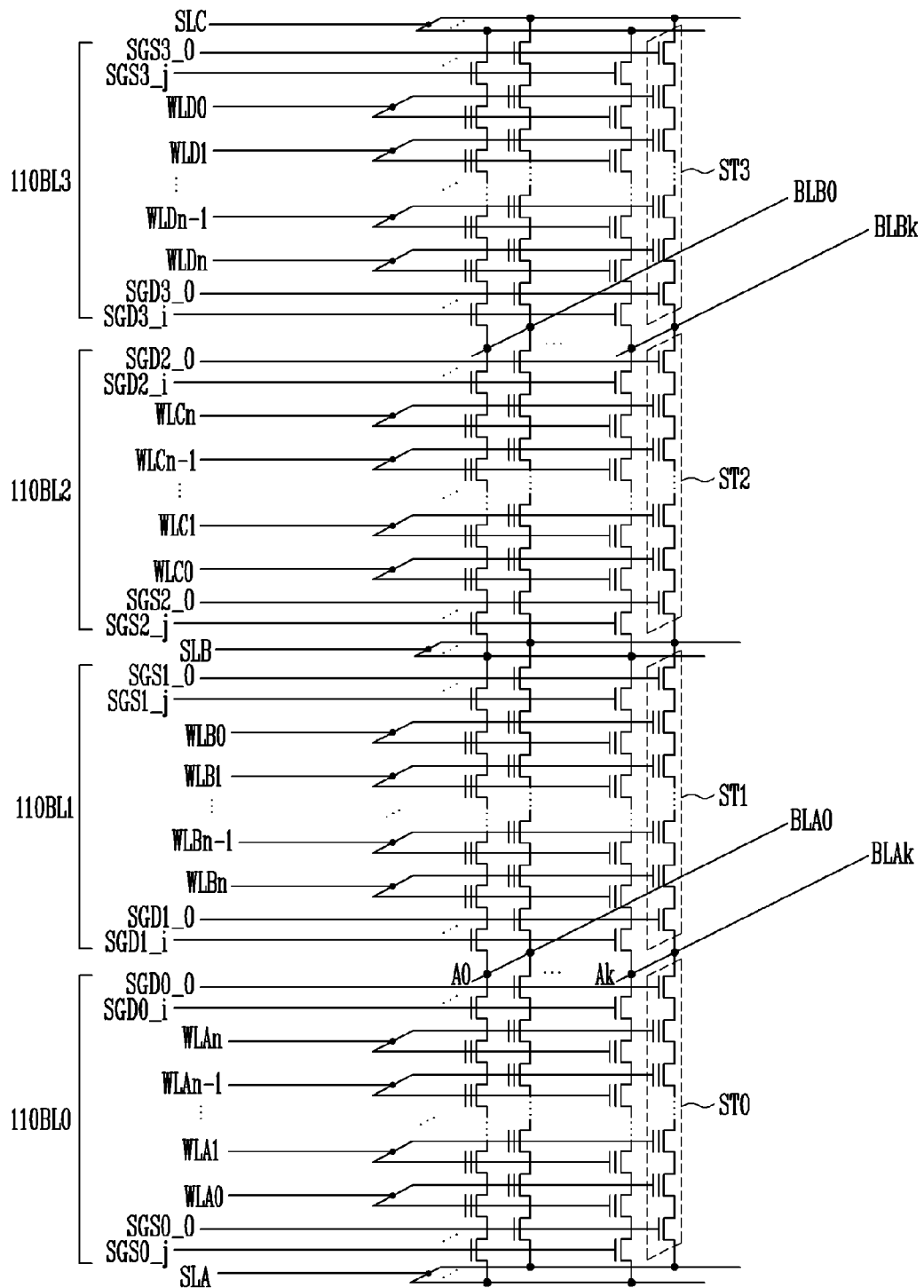

FIGS. 4A and 4B are views illustrating the memory array shown in FIG. 1.

Referring to FIG. 4A, the memory block layer 110BL0 may include a plurality of memory blocks MB to MB''''. In FIG. 4A, the memory block layer 110BL0 may include five memory blocks MB to MB'''' for illustrative purposes substrate. Each of the memory blocks MB may include memory strings that are connected between bit lines BL0 to BLk and the common source line SL. For illustrative purposes, three bit lines may be illustrated. In the memory block layer 110BL0, the memory blocks MB to MB'''' may share the bit lines BL0 to BLk, and the common source lines SL of the memory blocks MB to MB'''' may be separated from each other. The bit lines BL0 to BLk may extend in a direction parallel to the direction in which the memory blocks MB to MB'''' are horizontally arranged.

In each of the memory blocks MB to MB'''', the plurality of memory strings may be connected to each of the bit lines BL0 to BLk. Each of the memory strings may include the first selection transistor (or source selection transistor) SST coupled to the common source line SL, the second selection transistor (or drain selection transistor) SDT coupled to the bit line BL0 and the memory cells C0 to Cn vertically coupled in series between the first and second selection transistors SST and SDT.

The memory cells C0 to Cn, which are included in each of the memory strings in the memory block MB, may share word lines WLA0 to WLAn. In other words, the word lines WLA0 to WLAn of the memory cells C0 to Cn, included in each of the memory strings, may be coupled to each other. In other words, in the memory block MB, the word lines of the memory cells that are formed in the same layer and adjacent to each other in the horizontal direction may be coupled to each other.

The drain selection transistors SDT of the memory strings, which are respectively coupled to the bit lines BL0 to BLk, in the memory block MB may share a drain selection line (e.g., SGD0_0). In other words, drain selection lines (e.g., SGD0_0) of the drain selection transistors SDT of the memory strings, which are respectively coupled to the bit lines BL0 to BLk, may be coupled to each other. The drain selection transistors SDT of the memory strings, which are coupled to the same bit line (e.g., BL0) in the memory block MB, may include different drain selection lines SGD0_0 to SGD0_$i$. In other words, the drain selection lines SGD0_0 to SGD0_$i$ of the drain selection transistors SDT of the memory strings coupled to the same bit lines BL0 may be separated from each other. Thus, the drain selection transistors SDT, which are coupled to the same bit line BL0, may be independently operated by different operating voltages. The drain selection lines SGD0_0 to SGD0_$i$ may extend in a direction crossing the bit lines BL0 to BLk.

The source selection transistors SST of the memory strings, which are respectively coupled to the bit lines BL0 to BLk in the memory block MB, may a share source selection line (e.g., SGS0_0). In other words, source selection lines (e.g., SGS0_0) of the source selection transistors SST of the memory strings, which are respectively coupled to the bit lines BL0 to BLk, may be coupled to each other. However, the source selection transistors SST of the memory strings coupled to the same bit line (e.g., BL0) in the memory block MB may include different source selection lines SGS0_0 to SGS0_$i$. In other words, the source selection lines SGS0_0 to SGS0_$i$ of the source selection transistors SST of the memory strings, coupled to the same bit lines BL0, may be separated from each other. Therefore, the source selection transistors SST coupled to the same bit line BLA0 may be operated by different operating voltages. These source selection lines SGS0_0 to SGS0_$i$ may extend in a direction crossing the bit lines BL0 to BLk.

However, all the source selection lines SGS0_0 to SGS0_$i$ in the memory block MB may be coupled to each other in the memory block according to change in design. In addition, operating voltages applied to memory blocks during a read operation, a program operation and an erase operation may vary depending on how the source selection lines SGS0_0 to SGS0_$i$ are coupled in the memory block MB.

The source selection lines SGS0_0 to SGS0_$i$, the word lines WLA0 to WLAn, the drain selection lines SGD0_0 to SGD0_$i$ and the common source lines SL of the memory block MB in the memory block layer 110BL0 may be separated from source selection lines (not illustrated), word lines (not illustrated), drain selection lines (not illustrated) and common source lines (not illustrated) of another memory block MB'. In other words, the source selection lines SGS0_0 to SGS0_$i$, the word lines WLA0 to WLAn, the drain selection lines SGD0_0 to SGD0_$i$ and the common source lines SL of each of the memory blocks MB in the memory block layer 110BL0 may be separated from each other.

Referring to FIG. 4B, at least two of the memory block layers described above with reference to FIG. 4A may be stacked. According to an embodiment, four memory block layers, i.e., the memory block layers 110BL0 to 110BL3 may be stacked on top of one another. Memory blocks (or memory strings), which are included in an odd-numbered memory block layer 110BL0 or 110BL2, and memory blocks (or memory strings), which are included in an even-numbered memory block layer 110BL1 or 110BL3, may share bit lines BLA0 to BLAk or BLB0 to BLBk or a common source line SLA, SLB or SLC. More specifically, the lowermost memory block layer 110BL0 and the memory block layer 110BL1, which is located above the lowermost memory block layer 110BL0, may share lower bit lines BLA0 to BLAk, and the uppermost memory block layer 110BL3 and the memory block layer 110BL2, which is located under the uppermost memory block layer 110BL3, may share upper bit lines BLB0 to BLBk.

More specifically, the odd-numbered memory block layer 110BL2 may share the bit lines BLB0 to BLBk with the even-numbered memory block layer 110BL3, located above the odd-numbered memory block layer 110BL2, and the odd-numbered memory block layer 110BL2 may share the common source lines SL with the even-numbered memory block layer 110BL1 located under the odd-numbered memory block layer 110BL2. In addition, the even-numbered memory block layer 110BL1 may share the common source lines SL with the odd-numbered memory block layer 110BL2 located above the even-numbered memory block layer 110BL1, and the even-numbered memory block layer 110BL1 may share the bit lines BLA0 to BLAk with the odd-numbered memory block layer 110BL0 located under the even-numbered memory block layer 110BL1. To this end, the bit lines BLA0 to BLAk and the bit lines BLB0 to BLBk may be formed in different layers, and the common source lines SL may be formed in different layers.

As described above, in order that the memory block layers 110BL0 to 110BL3 share the bit lines BLA0 to BLAk and BLB0 to BLBk and the common source lines SL, the memory block layers may be stacked such that the memory blocks included in the odd-numbered memory block layers 110BL0 and 110BL2 and the memory blocks included in the even-numbered memory block layers 110BL1 and 110BL3 may have vertically symmetrical shapes.

Word lines WLA0 to WLAn, WLB0 to WLBn, WLC0 to WLCn and WLD0 to WLDn of the memory block layers 110BL0 to 110BL3 may be coupled to each other. In other words, the word lines WLA0 to WLAn, WLB0 to WLBn, WLC0 to WLCn and WLD0 to WLDn of the memory block layers 110BL0 to 110BL3 may be vertically coupled to each other. Word lines of memory blocks, which are vertically stacked on top of one another, may be vertically coupled to each other. On the other hand, word lines of memory blocks, which are horizontally arranged, may not be coupled to each other.

Source selection lines SGS0_0 to SGS0_j, SGS1_0 to SGS1_j, SGS2_0 to SGS0_j and SGS3_0 to SGS3_j of the memory block layers 110BL0 to 110BL3 may be selectively coupled to each other. In addition, drain selection lines SGD0_0 to SGD0_i, SGD1_0 to SGD1_i, SGD2_0 to SGD2_i and SGD3_0 to SGD3_i of the memory block layers 110BL0 to 110BL3 may be selectively coupled to each other. However, the above-described connection structure may change depending on the connection between a voltage supply circuit and a read/write circuit. The word lines WLA0 to WLAn, WLB0 to WLBn, voltages applied to WLC0 to WLCn and WLD0 to WLDn, the source selection lines SGS0_0 to SGS0_j, SGS1_0 to SGS1_j, SGS2_0 to SGS0_j and SGS3_0 to SGS3_j, and the drain selection lines SGD0_0 to SGD0_i, SGD1_0 to SGD1_i, SGD2_0 to SGD2_i and SGD3_0 to SGD3_i of the memory block layers 110BL0 to 110BL3 may change according to a connecting method.

The memory block layers 110BL0 to 110BL3 may share the common source lines SL. In other words, the common source lines SL of the memory block layers 110BL0 to 110BL43 may be vertically coupled to each other. Like the word lines WLA0 to WLAn, common source lines in different memory blocks may be coupled in the vertical direction but in the horizontal direction.

Referring again to FIG. 1, the voltage supply circuit 120 may be suitable for applying operating voltages to local lines SL, SGS, WL0 to WLn and SGD in memory blocks in order to perform data input and output operations on a selected memory block, among the memory blocks, such as a read operation, a program loop or an erase loop. Basically, the voltage supply circuit 120 may apply a read voltage to a word line (selected word line) of selected memory cells and a read pass voltage to word lines (unselected word lines) of unselected memory cells during a read operation. In addition, the voltage supply circuit 120 may apply a program voltage to the word line (selected word line) of the selected memory cells and a program pass voltage to the word lines (unselected word lines) of the unselected memory cells during a program operation. In addition, the voltage supply circuit 120 may apply a negative voltage of, for example, −10V, to the word lines WL0 to WLn of the memory cells during an erase operation.

The read/write circuit 130 may be coupled to the memory blocks included in the memory block layers 110BL0 to 110B3 through the bit lines BL. In addition, the read/write circuit 130 may selectively precharge or discharge the selected bit lines BL in response to data stored in the memory cells during the program operation, and the read/write circuit 130 may sense a change in voltage (or change in current) of the selected bit lines BL and latch the data stored in the memory cells during the read operation. The read/write circuit 130 may further include a page buffer.

Hereinafter, a method of manufacturing the above-described semiconductor device may be described.

FIGS. 5 to 15 are cross-sectional views illustrating a method of manufacturing a semiconductor device according to an embodiment.

Referring to FIG. 5, a source region 103 may be formed in a semiconductor substrate 101. The source region 103 may be formed by injecting 5-valence impurities. In addition, insulating layers 107 and 109 including different materials may be alternately formed over the semiconductor substrate 101 in which the source region 103 is formed. For example, the first insulating layers 107 including nitride layers and the second insulating layers 109 including oxide layers may be alternately formed over the semiconductor substrate 101. As a result, the nitride layers 107 and the oxide layers 109 may be alternately stacked over the semiconductor substrate 101. During subsequent processes, selection lines or word lines may be formed in regions from which the second insulating layers 109 are removed. Therefore, the number of second insulating layers 109 to be stacked may be determined by the number of selection lines and word lines to be stacked.

Before the first insulating layers 107 and the second insulating layers 109 are stacked, an etch stop layer 105 may be formed over the semiconductor substrate 101.

Subsequently, channel holes 111 may be formed by etching the etch stop layer 103 and the regions of the insulating layers 107 and 109 in which the vertical channel layers will be formed.

Referring to FIG. 6, charge storage layers 113, tunnel insulating layers 115 and vertical channel layers 117 may be formed in the channel holes 111. For example, after the charge storage layer 113, the tunnel insulating layer 115 and the vertical channel layer 117 are sequentially formed, the charge storage layer 113, the tunnel insulating layer 115 and the vertical channel layer 117, which are located above the insulating layers 107, may be removed so that the charge storage layer 113, the tunnel insulating layer 115 and the vertical channel layer 117 may remain only in the channel holes 111.

Therefore, the charge storage layer 113 may be formed on a sidewall of the channel hole 111, and the vertical channel layer 117 may be formed at the center of the channel hole 111. In addition, the tunnel insulating layer 115 may be formed between the charge storage layer 113 and the vertical channel layer 117. A lower portion of the vertical channel layer 117 may be coupled to the source region 103. Although a lower part of the charge storage layer 113 may also be coupled to the source region 103, the charge storage layer 113 may be separated from the source region 103 during subsequent processes.

In addition to the above-described method, another method may be used to form the charge storage layer 113, the tunnel insulating layer 115 and the vertical channel layer 117 may be formed in the channel hole 111.

The charge storage layer 113 may include a polysilicon layer, a dielectric layer (a charging trapping layer) a metal layer or a silicide layer. For example, the charge storage layer 113 may include a $Si_3N_4$ layer or a RuSi layer and have a thickness of approximately 10 nm.

Figure 7:
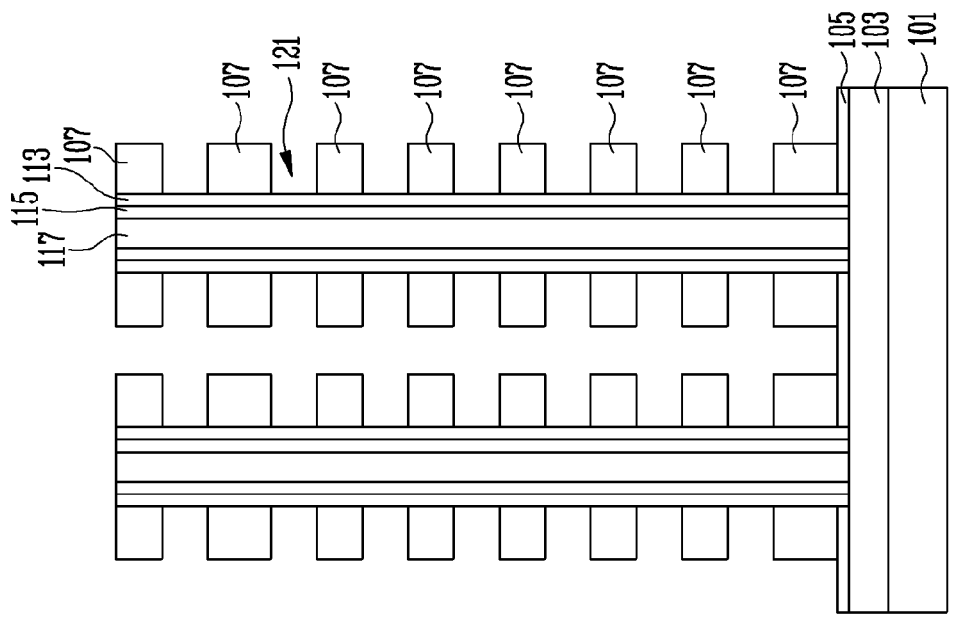

Referring to FIG. 7, portions of the insulating layers 107 and 109 may be etched in order to define regions where local lines (word lines and selection lines) are formed (i.e., regions where memory strings are formed). As a result, the insulating layers 107 and 109 may remain in the form of local lines to be formed during subsequent processes, and slits 119 may be formed between the insulating layers 107 and 109. Regions where memory blocks are formed may also be defined by the slits 119.

Figure 8:
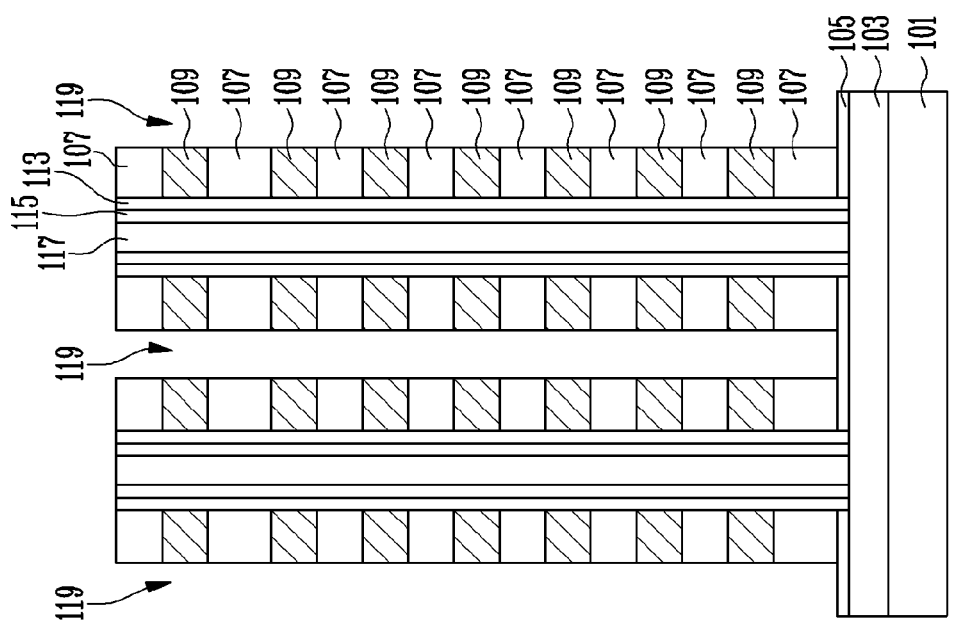

Referring to FIG. 8, the second insulating layers 109 that remain between the first insulating layers 107 may be removed. The second insulating layers 109 may be removed by a wet etch process. Since the first insulating layers 107 and the second insulating layers 109 include different materials, the first insulating layers 107 may remain even when the second insulating layers 109 are removed. As the second insulating layers 109 are removed, recesses 121 may be formed between the first insulating layers 107. Regions from which the second insulating layers 109 are removed, i.e., the recesses 121 may be defined as regions where local lines are formed. Portions of the charge storage layer 113 may be exposed through the recesses 121.

Figure 9:
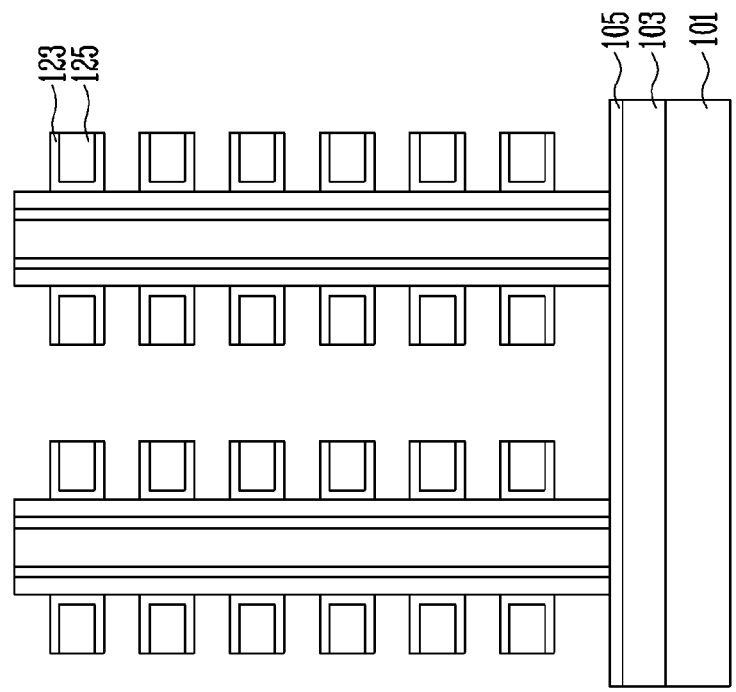

Referring to FIG. 9, a blocking insulating layer 123 may be formed on the sidewall of the recess 121 and the exposed surface of the charge storage layer 113. The recess 121 on which the blocking insulating layer 123 is formed may be filled with a conductive layer 125. The blocking insulating layer 123 may include an aluminum oxide layer, and the conductive layer 125 may include a tungsten layer.

For example, the blocking insulating layer 123 may be formed to such a small thickness on an entire surface including the sidewall of the recess 121 and the exposed surface of the charge storage layer 113 that the blocking insulating layer 123 may not fill the recess 121. Subsequently, the conductive layer 125 may be formed on the entire surface of the charge storage layer 113 to fill the recess 121. Thereafter, an etch process may be performed so that the blocking insulating layers 123 and the conductive layers 125 may remain only in the recesses 121. As a result, local lines may be formed. The lowermost conductive layer, among the conductive layers 125, may be a source selection line, and the uppermost conductive layer thereamong may be a drain selection line. In addition, intermediate conductive layers may be word lines.

Figure 10:
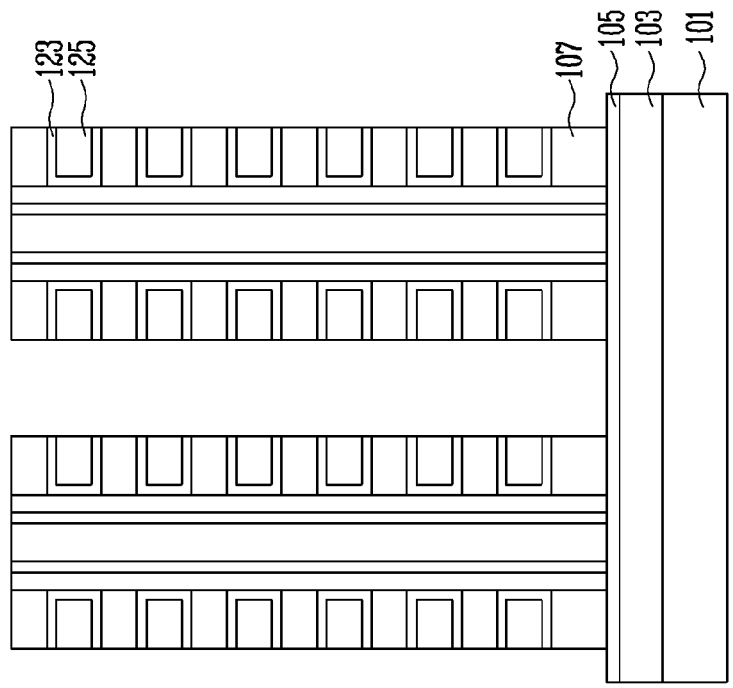

Referring to FIG. 10, the first insulating layers 107 may be removed. As a result, portions of the charge storage layer 113 may be exposed between the conductive layers 125 surrounded by the blocking insulating layers 123.

Figure 11:
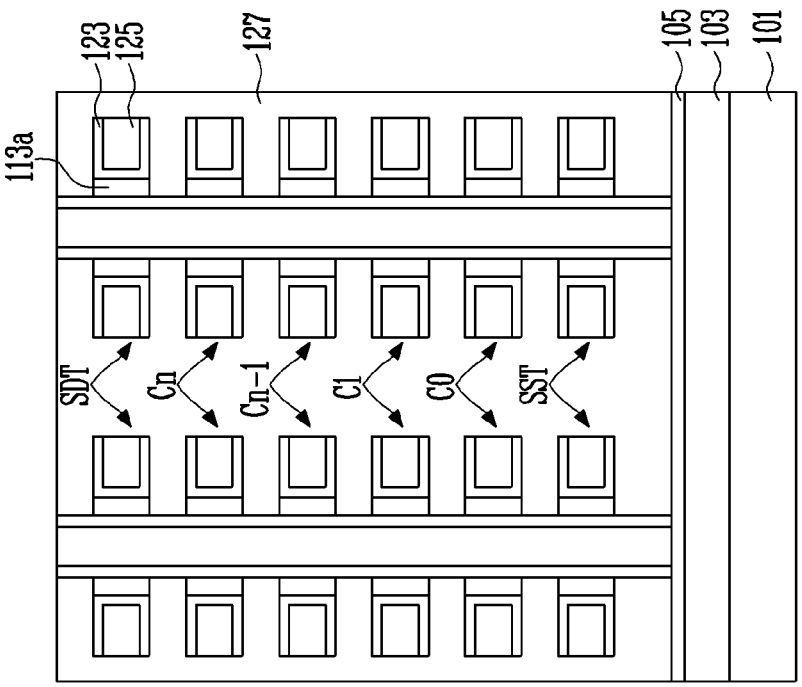

Referring to FIG. 11, the charge storage layer 113, which is exposed between the conductive layers 125, may be removed. Since the portions of the charge storage layer 113 are removed, charge storage layers 113a may remain between the tunnel insulating layer 115 and the blocking insulating layers 123. Since the charge storage layer 113 is formed to a small thickness, upper and lower portions of the charge storage layers 113a may remain substantially undamaged between the tunnel insulating layer 115 and the blocking insulating layers 123. The processes described above with reference to FIGS. 10 and 11 may be performed or omitted as necessary.

The source selection transistor SST, the memory cells C0 to Cn and the drain selection transistor SDT that are vertically stacked may be formed by the charge storage layers 113a, the blocking insulating layers 123 and the conductive layers 125 that surround the vertical channel layer 117 at different heights. In other words, memory strings ST0 of the lowermost memory block may be vertically formed.

Figure 12:
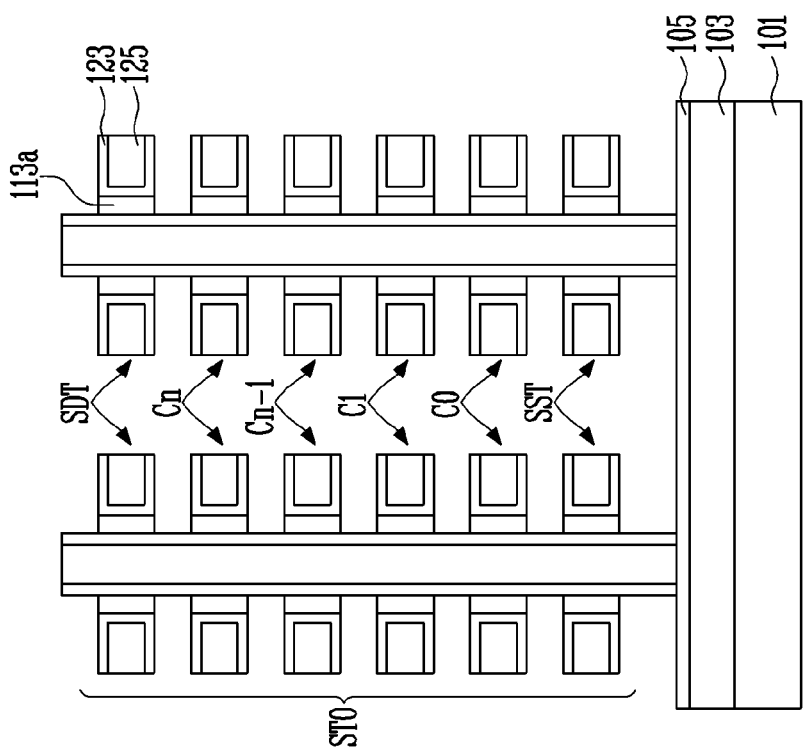

Referring to FIG. 12, a first interlayer insulating layer 127 may be formed over the entire structure, and a planarization process may be formed thereon. The planarization process may be performed on the first interlayer insulating layer 127 until upper surfaces of the vertical channel layers 117 are exposed.

Figure 13:
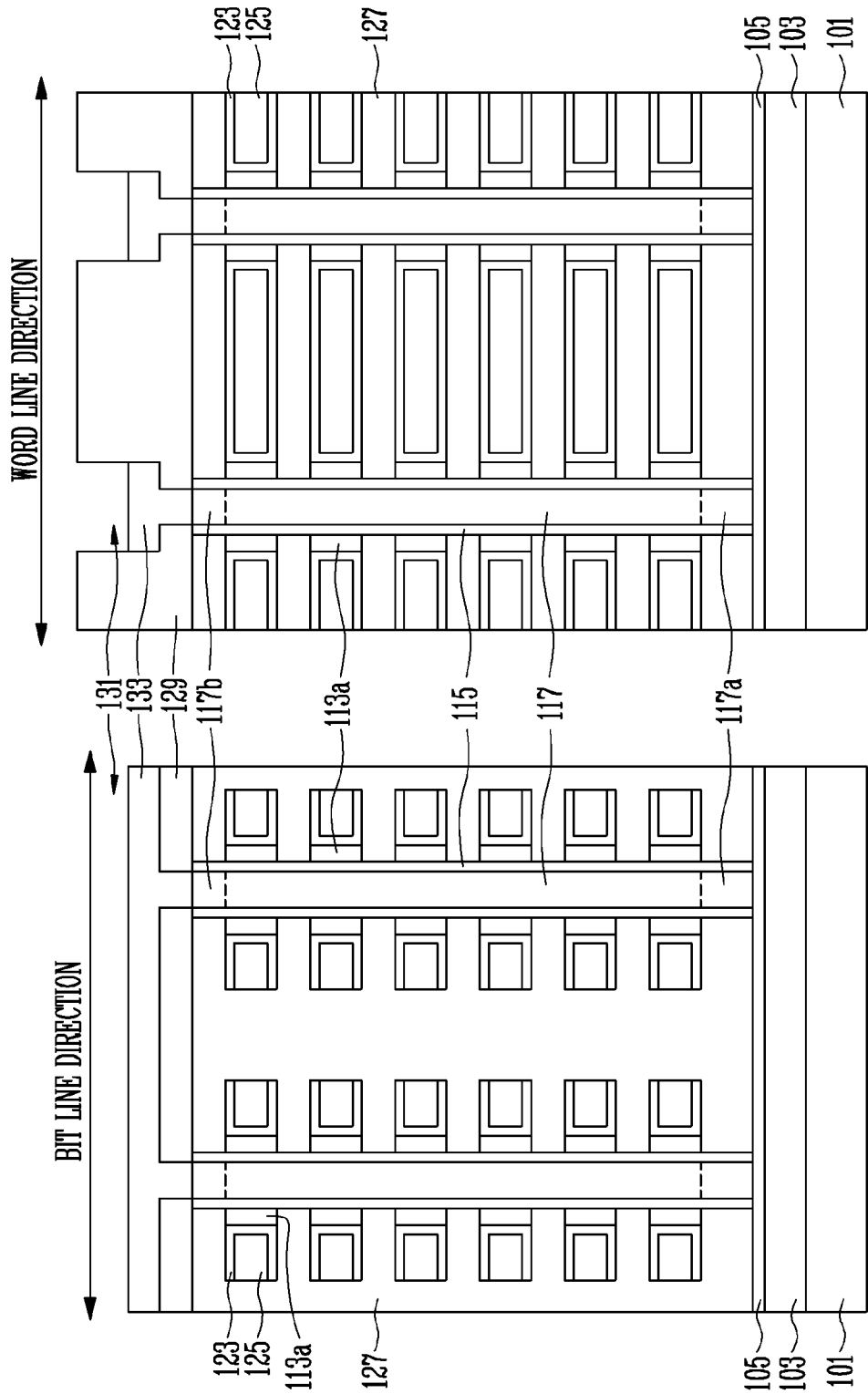

Referring to FIG. 13, a process of forming bit lines coupled to the memory strings ST0 may be performed. A bit line may have a stacked structure of a conductive layer and a silicon layer formed on the conductive layer. A barrier metal layer may further be formed between the conductive layer and the silicon layer. The above process is described below in detail.

First, a bit line insulating layer 129 may be formed over the first interlayer insulating layer 127 including the memory strings ST0. Subsequently, damascene patterns 131 may be formed by etching portions of the bit line insulating layer 129 so that the damascene patterns 131 may be exposed on the upper surfaces of the vertical channel layers 117 included in the memory strings ST0. Each of the damascene patterns 131 may include a contact hole and a trench. The vertical channel layer 117 may be exposed through the contact hole. The trench may be formed on the contact hole and have a width greater than or equal to the contact hole. A contact plug may be formed in the contact hole, and wiring may be formed in the trench. In other words, the trench corresponding to an upper part of the damascene pattern 131 may be formed to define a region where a bit line is formed, and the trench may have the same linear shape as the bit line. The contact hole corresponding to a lower part of the damascene pattern 131 may be formed to define a region where the contact plug is formed to connect the bit line and the vertical channel layer 117. However, since a process of forming the damascene patterns 131 is widely known in the art, a detailed description of the above process will be omitted.

A conductive layer 133 may be formed to fill portions of the damascene patterns 131. The conductive layer 133 may include a tungsten layer or a copper layer. The conductive layer 133 may completely fill the contact holes of the damascene patterns 131 and partially fill the trenches. For example, after the conductive layer 133 may be formed to fill the damascene patterns 131, a planarization process and an etch-back process may be performed thereon.

Before the conductive layer 133 is formed, a barrier metal layer (not illustrated) may be formed over an entire surface of the bit line insulating layer 129 including the damascene patterns 131. The barrier metal layer may include a titanium layer, a titanium nitride layer, or a stacked structure of the titanium layer and the titanium nitride layer.

Before the bit line insulating layer 129 is formed, impurity regions 117b may be formed at upper portions of the vertical channel layers 117 by injecting 5-valence impurities into the vertical channel layers 117. Electrical characteristics of the drain selection transistor SDT may be improved by the impurity region 117b. In addition, a lower portion of the vertical channel layer 117 may contact the source region 103 including 5-valence impurities. The impurities of the source region 103 may be diffused into the lower portion of the vertical channel layer 117, and the impurity region 117a may be formed on the lower portion of the vertical channel layer 117. Electrical characteristics of the source selection transistor SST may be improved by the impurity region 117a.

Figure 14:
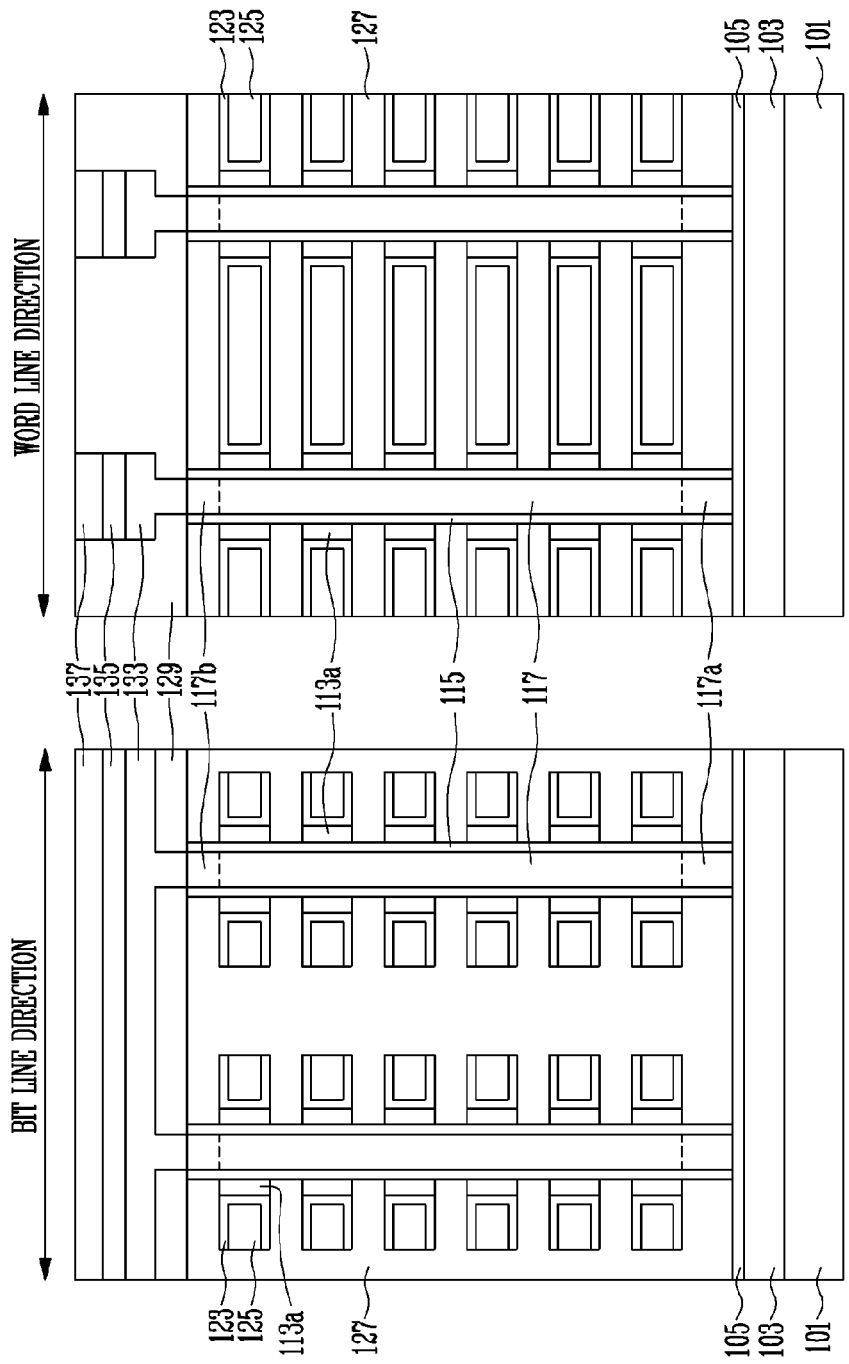

Referring to FIG. 14, a barrier metal layer 135 and a silicon layer 137 may be sequentially stacked in an empty space of the damascene patterns 131. For example, the barrier metal layer 135 and the silicon layer 137 may be sequentially formed over the entire structure to fill the damascene patterns 131, and a planarization process may be performed thereon. As a result, the barrier metal layer 135 and the silicon layer 137 may be formed over the conductive layer 133.

The barrier metal layer 135 may include a titanium layer, a titanium nitride layer, or a stacked structure of the titanium layer and the titanium nitride layer. The silicon layer 137 may include a polysilicon layer including impurities. The silicon layer 137 may include 5-valence impurities.

The barrier metal layer 135 may be removed. However, the barrier metal layer 135 may be formed to prevent an abnormal reaction between the conductive layer 133 and the silicon layer 137 or prevent the copper or tungsten of the conductive layer 133 from being diffused into the silicon layer 137. In addition, the barrier metal layer 135 may also prevent the impurities of the silicon layer 137 from being diffused into the conductive layer 133.

Through the above-described processes, the bit line may include a stacked structure of the conductive layer 133 and the silicon layer 137 formed on the conductive layer 133.

Figure 15:
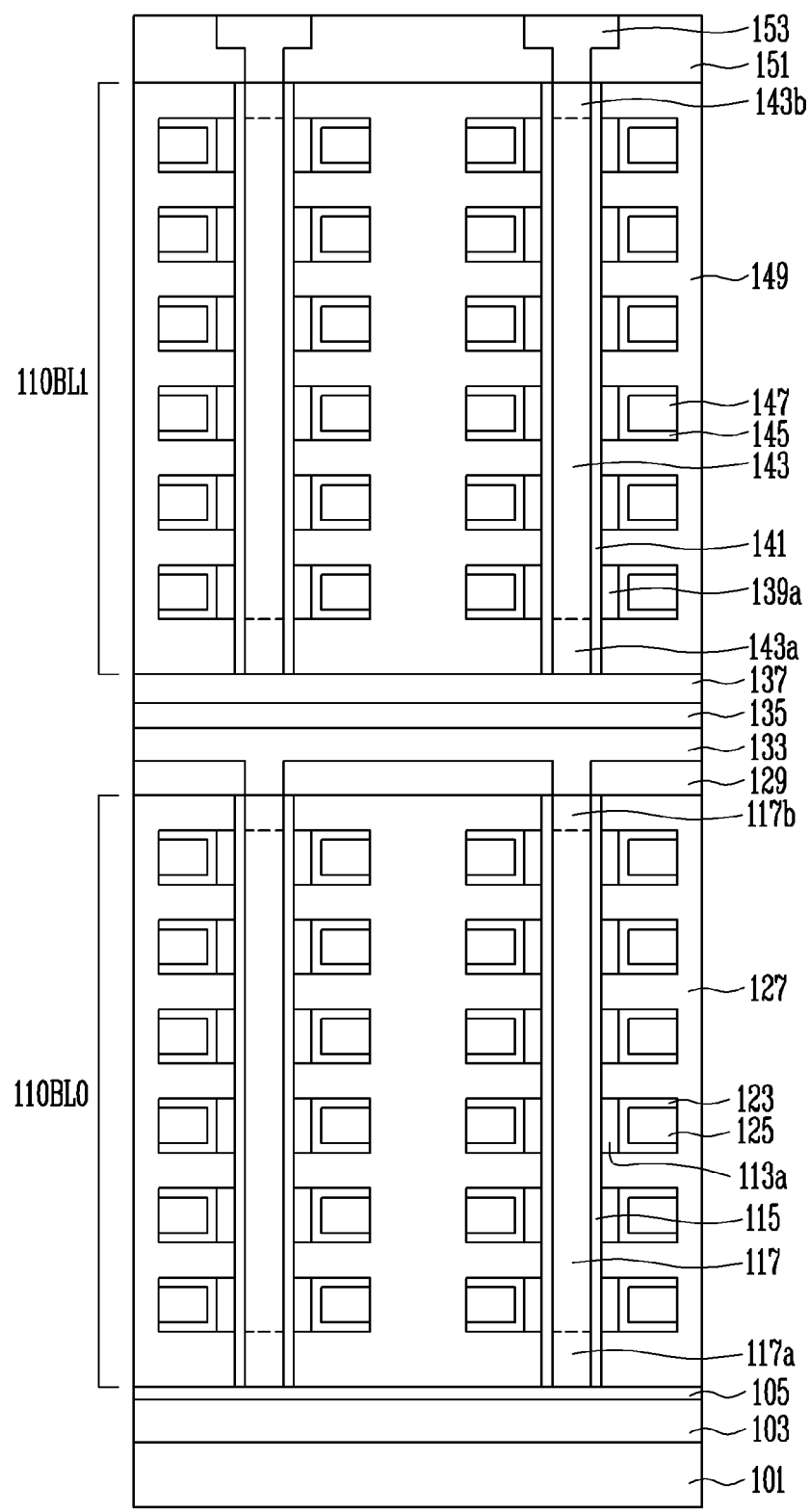

Referring to FIG. 15, the second memory block layer 110BL1 may be formed over the entire structure in which the bit lines are formed. According to the method described above with reference to FIGS. 5 to 12, vertical channel layers 143, tunnel insulating layers 141, charge storage layers 139a, blocking insulating layers 145 and local line conductive layers 147 may be formed. Subsequently, a second interlayer insulating layer 149 may be formed.

Drain selection transistor, memory cells and drain selection transistors that are vertically stacked may be formed by the charge storage layers 139a, the blocking insulating layers 145 and the conductive layers 147 that surround the vertical channel layer 143 at different heights. In other words, memory strings of the lowermost memory block may be vertically formed. However, since the first memory block layer 110BL0 and the second memory block layer 110BL1 are to include symmetrical shapes, a drain selection transistor may be formed by the lowermost charge storage layer 139a, the lowermost blocking insulating layer 145 and the lowermost conductive layer 147, and a source selection transistor may be formed by the uppermost charge storage layer 139a, the uppermost blocking insulating layer 145 and the uppermost conductive layer 147. In addition, memory cells may be formed by the intermediate charge storage layers 139a, the intermediate blocking insulating layers 145 and the intermediate conductive layers 147.

The vertical channel layer 143 may include a polysilicon layer. The polysilicon layer may have conductivity when 5-valence impurities having a predetermined concentration or more are included in the polysilicon layer. However, the vertical channel layer 143 is not to have conductivity. In other words, any impurity is not to be included in a portion of the vertical channel layer 143 that functions as a channel region of the selection transistors and the memory cells. Therefore, a lower portion of the vertical channel layer 143 which functions as a drain region of the drain selection transistor of the second memory block layer 110BL1 may also not include impurities. As a result, electrical characteristics of the drain selection transistor may be deteriorated. The timing of supplying impurities may be controlled when the vertical channel layer 143 is formed so that impurities may be included only in the lower portion of the vertical channel layer 143. However, since the vertical channel layer 143 is evenly formed from the entire surface, it may be difficult to include impurities only in the lower portion of the vertical channel layer 143.

However, by forming a bit line having a stacked structure of the conductive layer 133 and the silicon layer 137 formed on the conductive layer 133, the impurity region 143a may be formed only on the lower portion of the vertical channel layer 143 of the second memory block layer 110BL1. More specifically, the lower portion of the vertical channel layer 143 of the second memory block layer 110BL1 may directly contact the silicon layer 137 of the bit line. As a result, the impurities of the silicon layer 137 may be diffused into the lower portion of the vertical channel layer 143, and an impurity region 143a may be formed at the bottom of the vertical channel layer 143. Therefore, the impurity region 143a that serves as a drain of the drain selection transistor of the second memory block layer 110BL1 may be formed at the bottom of the vertical channel layer 143. As a result, electrical characteristics of the entire memory string as well as electrical characteristics of the drain selection transistor.

Subsequently, a process of forming a source region in the second memory block layer 110BL1 may be performed. First, an insulating layer 151 may be formed. Subsequently, damascene patterns may be formed by etching portions of the insulating layer 151. In addition, source lines 153 corresponding to the source region may be formed in the damascene patterns.

Before the insulating layer 151 is formed, impurity regions 143b may be formed at upper portions of the vertical channel layers 143 by injecting 5-valence impurities into the vertical channel layers 143. Electrical characteristics of the source selection transistor SST may be improved by the impurity region 143b.

However, the bit line may be formed into another form.

Figure 16:
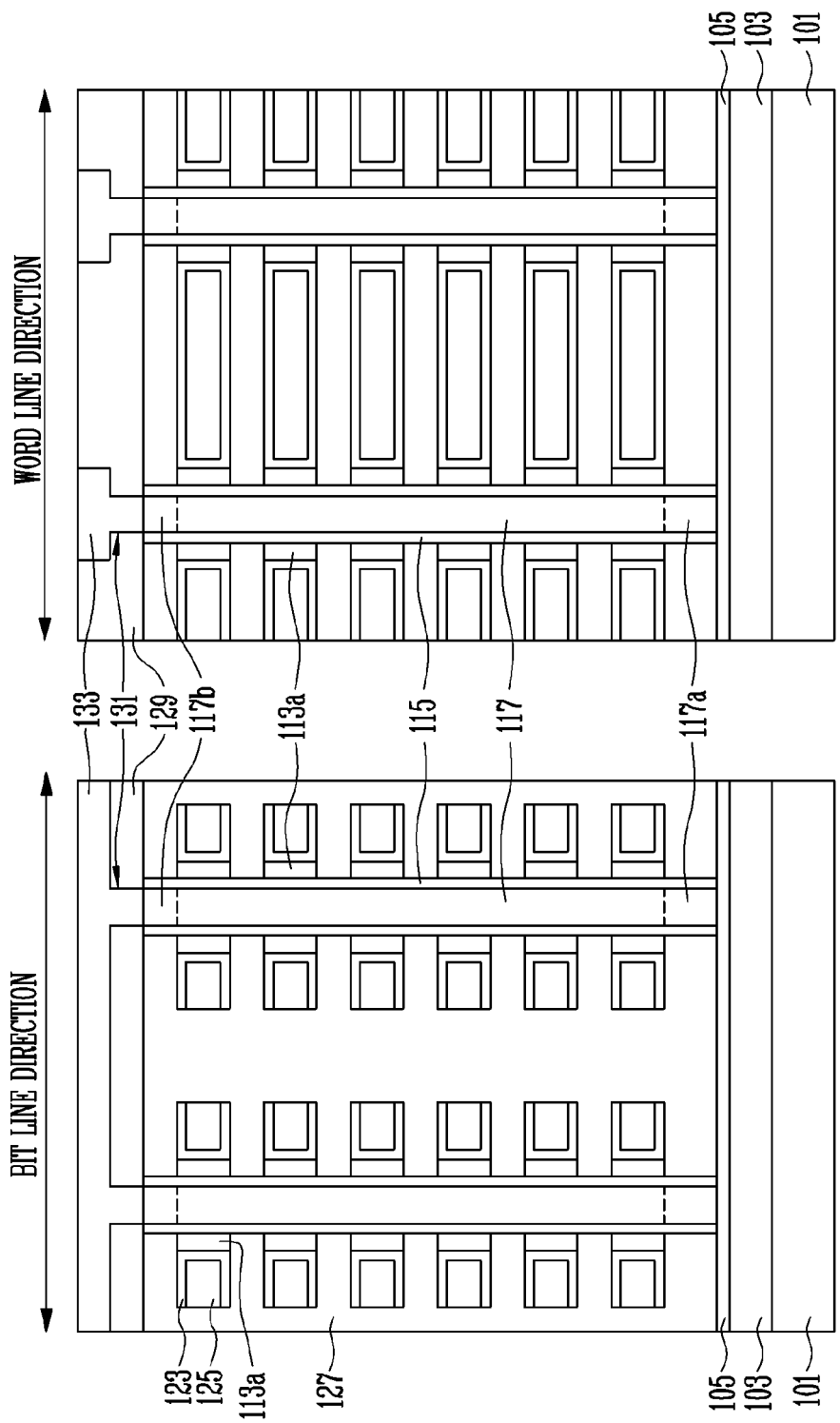
FIGS. 16 to 18 are cross-sectional views illustrating a method of manufacturing a semiconductor device according to an embodiment.
Figure 17:
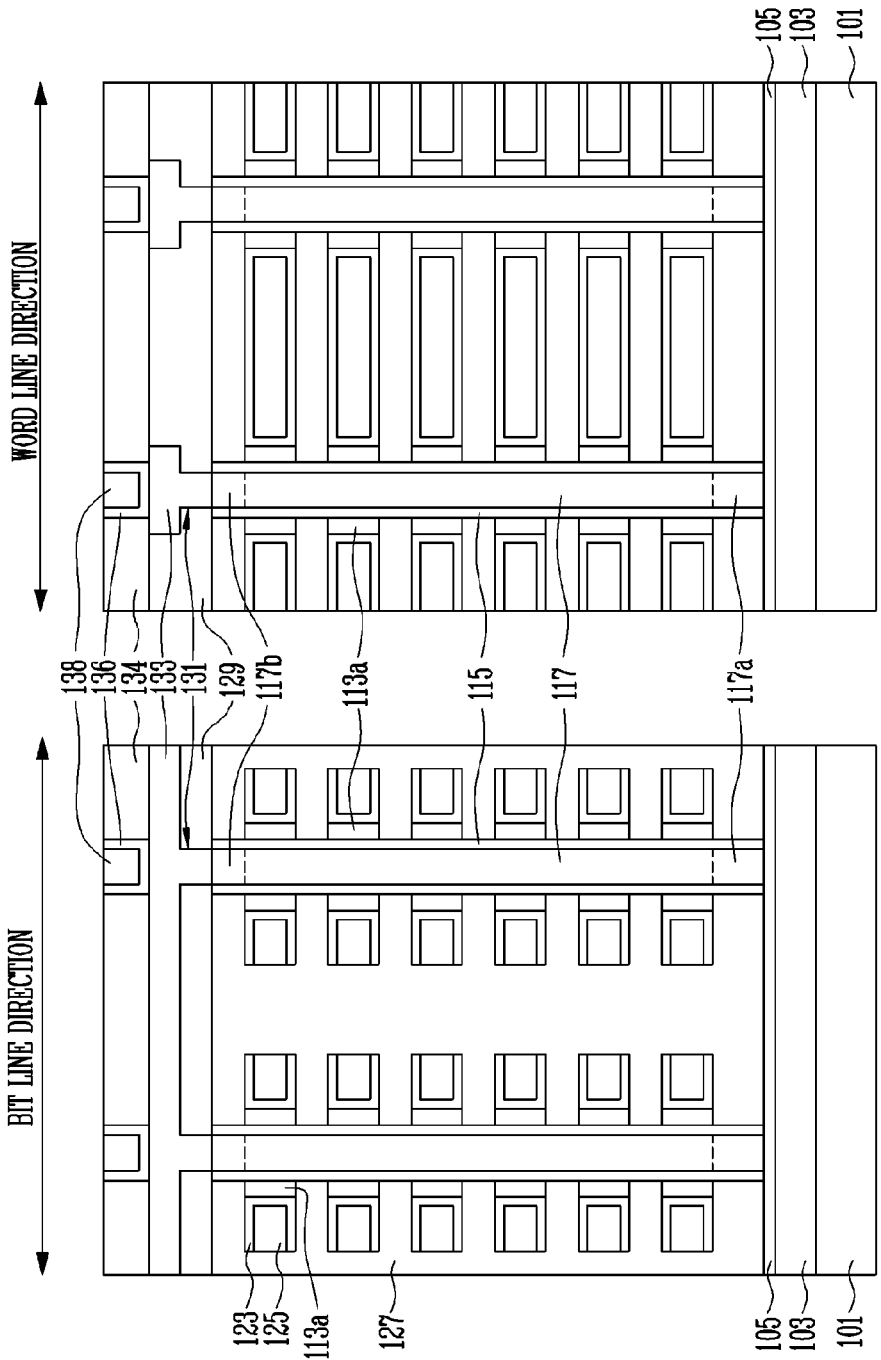
Figure 18:
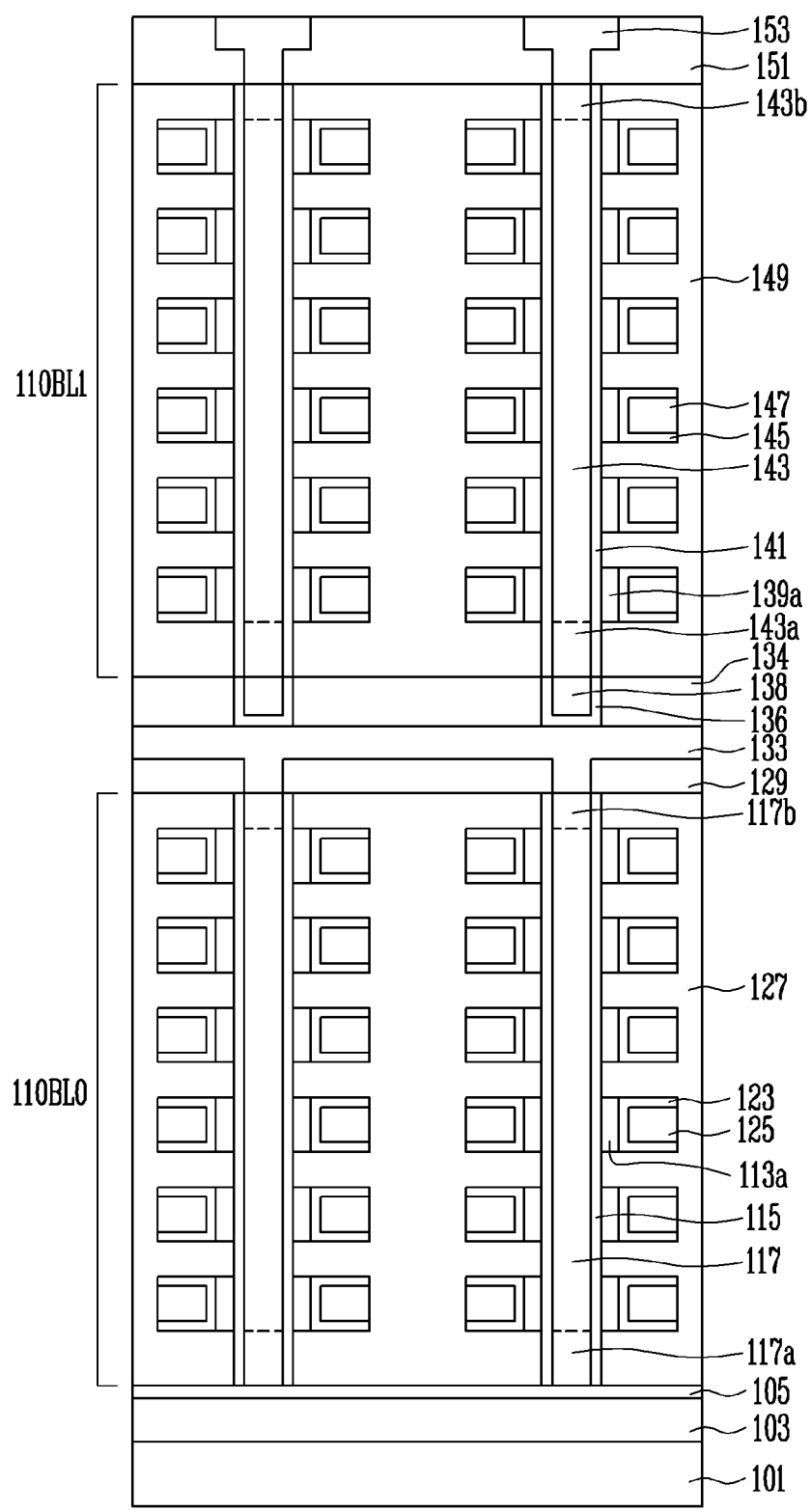

FIGS. 16 to 18 are cross-sectional views illustrating a method of manufacturing a semiconductor device according to an embodiment.

Referring to FIG. 16, after memory strings of first memory block layers are formed by the method described above with reference to FIGS. 5 to 12, a process of forming bit lines coupled to the memory strings may be performed. Similarly, a bit line may include a stacked structure of a conductive layer and a silicon layer formed on the conductive layer. A barrier metal layer may further be formed between the conductive layer and the silicon layer.

First, the bit line insulating layer 129 may be formed over the first interlayer insulating layer 127 that includes vertically formed memory strings. Subsequently, the damascene patterns 131 may be formed by etching portions of the bit line insulating layer 129 so that the bit line insulating layer 129 may be exposed on upper surfaces of the vertical channel layers 117 included in the memory strings. Each of the damascene patterns 131 may include a contact hole and a trench. The vertical channel layer 117 may be exposed through the contact hole. The trench may be formed over the contact hole and have a width greater than or equal to the contact hole. The trench corresponding to an upper part of the damascene pattern 131 may be formed to define a region where a bit line is formed. The trench may have the same linear as the bit line. The contact hole corresponding to a lower part of the damascene pattern 131 may be formed to define a region where a contact plug is formed in order to couple the bit line, formed in the trench, and the vertical channel layer 117.

The conductive layer 133 may be formed to fill the damascene patterns 131. Bit lines may be formed by the conductive layer 133 so that the bit lines may be coupled to the vertical channel layer 117 located thereunder. The conductive layer 133 may include a tungsten layer or a copper layer. For example, after the conductive layers 133 may be formed over the entire structure to fill the damascene patterns 131, a planarization process may be performed thereon.

Before the conductive layers 133 are formed, a barrier metal layer (not illustrated) may be formed over the entire surface of the bit line insulating layer 129 including the damascene patterns 131. The barrier metal layer may include a titanium layer, a titanium nitride layer, or a stacked structure of the titanium layer and the titanium nitride layer.

Before the bit line insulating layer 129 is formed, each of the impurity regions 117b may be formed at each of the upper portions of the vertical channel layers 117 by injecting 5-valence impurities into the vertical channel layers 117.

Referring to FIG. 17, the insulating layer 134 may be formed over the entire structure including the conductive layer 133. Subsequently, a portion of the insulating layer 134 may be etched to form a contact hole through which a portion of the conductive layer 133 is exposed. The contact hole may be formed in a region where a vertical channel layer of a second memory block layer is formed in subsequent processes.

A barrier metal layer 136 and a silicon layer 138 may be sequentially formed in the contact hole. For example, the barrier metal layer 136 and the silicon layer 138 may be sequentially formed over the entire structure to fill the contact hole of the insulating layer 134, and a planarization process may be performed thereon. As a result, the barrier metal layer 136 and the silicon layer 138 may be formed in the shape of a plug.

The barrier metal layer 136 may include a titanium layer, a titanium nitride layer, or a stacked structure of a titanium layer and a titanium nitride layer. The silicon layer 138 may include a polysilicon layer including impurities. The silicon layer 138 may include 5-valence impurities.

The barrier metal layer 136 may be removed. However, in order to prevent an abnormal reaction between the conductive layer 129 and the silicon layer 138 or prevent copper or tungsten of the conductive layer 129 from being diffused into the silicon layer 138, the barrier metal layer 136 may be formed. In addition, the barrier metal layer 136 may also prevent the impurities of the silicon layer 138 forming being diffused into the conductive layer 129.

Through the above-described processes, the bit line including the silicon layer 138 formed in the shape of a plug may be formed on the conductive layer 133.

Referring to FIG. 18, the second memory block layer 110BL1 may be formed over the entire structure of first memory block layer 110BL0 including the silicon plugs 138. For example, the vertical channel layers 143, the tunnel insulating layers 141, the charge storage layers 139a, the blocking insulating layers 145 and the local line conductive layers 147 may be formed by the method described above with reference to FIG. 15. Subsequently, the second interlayer insulating layer 149 may be formed.

Subsequently, a process of forming a source region in the second memory block layer 110BL1 may be performed. First, after the insulating layer 151 is formed, portions of the insulating layer 151 may be etched to form damascene patterns. Subsequently, the source lines 153 corresponding to source regions may be formed in the damascene patterns.

Before the insulating layer 151 is formed, each of the impurity regions 143b may be formed at each of the upper portions of the vertical channel layers 143 by injecting 5-valence impurities into the vertical channel layers 143. Electrical characteristics of the source selection transistor SST may be improved by the impurity region 143b.

According to the above-described process, the lower portions of the vertical channel layers 143, included in the second memory block layer, may directly contact the silicon plugs 138. As a result, the impurities of the silicon plugs 138 may be diffused into the lower portions of the vertical channel layers 143, and the impurity regions 143a may be formed at the lower portions of the vertical channel layers 143. As a result, the impurity region 143a, which functions as a drain of the drain selection transistor of the second memory block layer 110BL1, may be formed at the lower portion of the vertical channel layer 143. In addition, electrical characteristics of the entire memory string as well as electrical characteristics of the drain selection transistor may be improved.

The source line may be formed by another method when a third memory block layer is formed.

Figure 19:
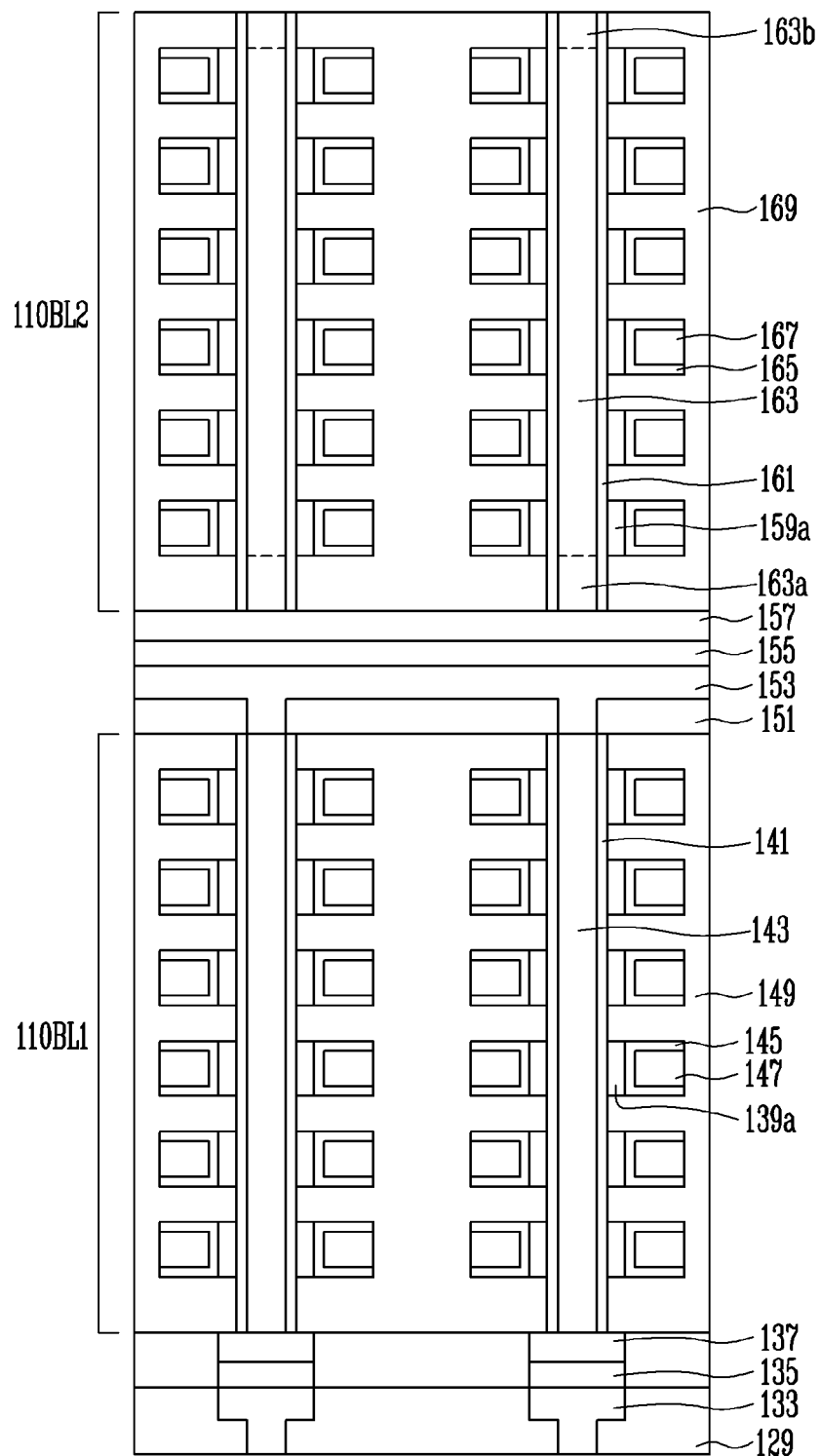
FIG. 19 is a cross-sectional view illustrating a method of manufacturing a semiconductor device according to an embodiment.

FIG. 19 is a cross-sectional view illustrating a method of manufacturing a semiconductor device according to an embodiment.

Referring to FIG. 19, after the memory strings of the second memory block layers 110BL1 are formed as illustrated in FIG. 18, the insulating layer 151, the conductive layer 153, a barrier metal layer 155 and a silicon layer 157 may be formed by using the method described above with reference to FIGS. 13 and 14. In other words, the insulating layer 151, the conductive layer 153, the barrier metal layer 155 and the silicon layer 157, which are provided to form a common source line corresponding to the source region of the second and third memory block layers 110BL1 and 110BL2, may be formed by the same method as that for forming the insulating layer 129, the conductive layer 133, the barrier metal layer 135 and the silicon layer 137 which are provided to form the bit line of the second memory block layer 110BL2. However, the insulating layer 151, the conductive layer 153, the barrier metal layer 155 and the silicon layer 157 for forming the common source line may be formed in a direction crossing the insulating layer 129, the conductive layer 133, the barrier metal layer 135 and the silicon layer 137, which are provided to form the bit line, are formed.

Subsequently, the third memory block layer 110BL2 may be formed over the entire structure in which the common source line is formed. For example, by the method described above with reference to FIGS. 5 to 12, vertical channel layers 163, tunnel insulating layers 161, charge storage layers 159a, blocking insulating layers 165 and local line conductive layers 167 may be formed. Thereafter, a third interlayer insulating layer 169 may be formed.

As the above-described processes are performed, the impurities of the silicon layers 157 may be diffused into lower portions of the vertical channel layers 163 of the third memory block layer 110BL2, and impurity regions 163a may be formed only in the lower portions of the vertical channel layers 163 of the third memory block layer 110BL2 by the diffused impurities. As a result, electrical characteristics of the entire memory string as well as electrical characteristics of the source selection transistor may be improved.

In addition, impurity regions 163b may be formed by injecting impurities into upper portions of the vertical channel layers 163 of the third memory block layer 110BL2. As a result, electrical characteristics of the entire memory string as well as electrical characteristics of the drain selection transistor may be improved.

The source line may be formed by yet another method when the third memory block layer is formed.

Figure 20:
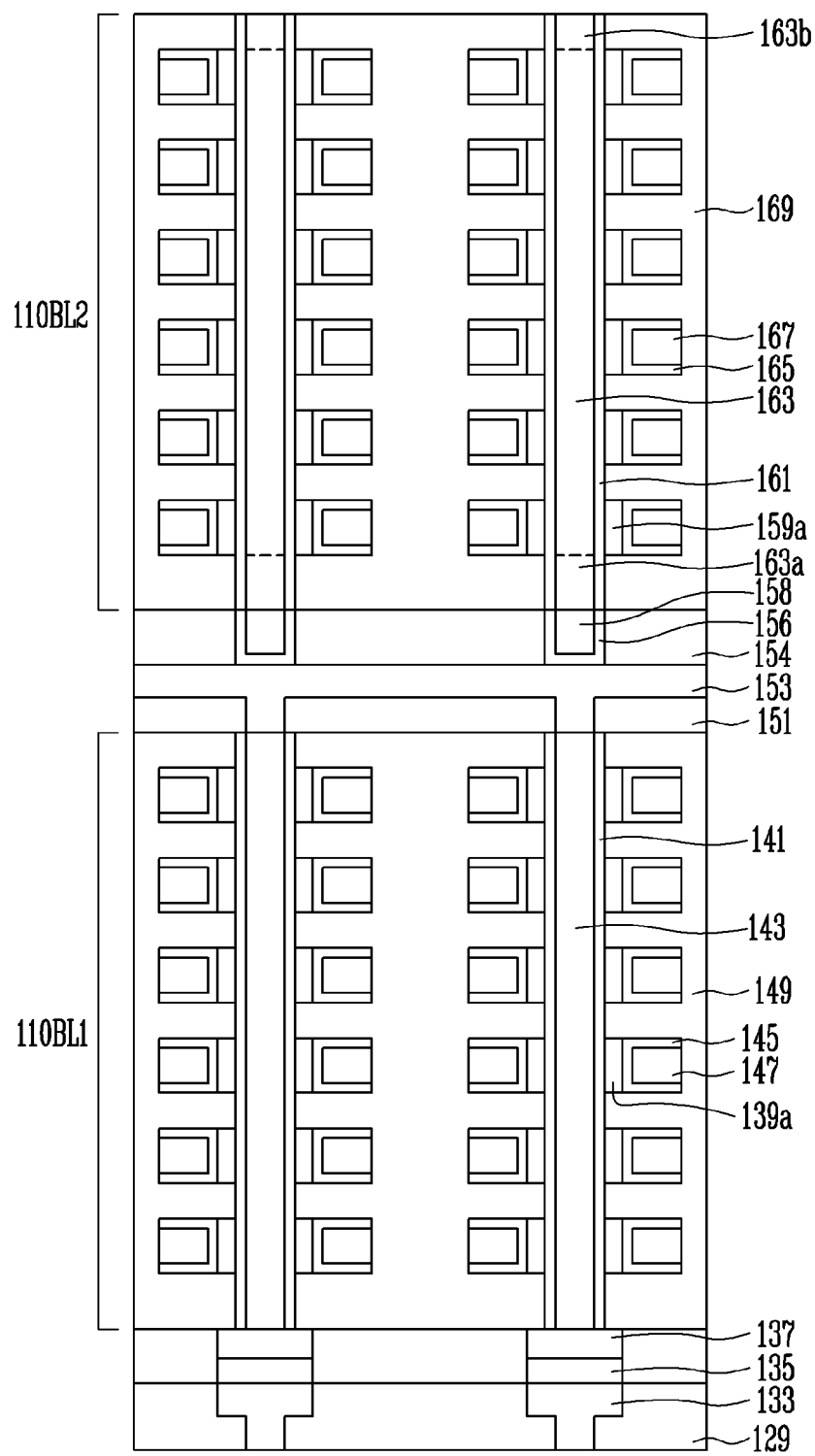
FIG. 20 is a cross-sectional view illustrating a method of manufacturing a semiconductor device according to an embodiment.

FIG. 20 is a cross-sectional view illustrating a method of manufacturing a semiconductor device according to an embodiment.

Referring to FIG. 20, the memory strings of the second memory block layers 110BL1 may be formed as illustrated in FIG. 18, the insulating layer 154 may be formed by the method described above with reference to FIG. 17, and barrier metal layers 156 and silicon layers 158 may be formed in contact holes of the insulating layer 154.

The insulating layer 154 may be formed over the entire structure of the conductive layer 153. Subsequently, portions of the insulating layer 154 may be etched to form contact holes through which the portions of the conductive layer 153 may be exposed. The barrier metal layer 156 and the silicon layer 158 may be formed in a region where the vertical channel layers 163 of the third memory block layer 110BL2 are formed.

The barrier metal layer 156 may include a titanium layer, a titanium nitride layer, or a stacked structure of the titanium layer and the titanium nitride layer. The silicon layer 158 may include a polysilicon layer including impurities. The silicon layer 158 may include 5-valence impurities. The barrier metal layer 156 may be removed.

Through the above-described process, a common source line including the silicon layer 158 formed in the shape of a plug may be formed over the conductive layer 153.

According to the above-described process, lower portions of the vertical channel layers 163, included in the third memory block layer 110BL2, may directly contact the silicon plugs 158. As a result, the impurities of the silicon plugs 158 may be diffused into the lower portions of the vertical channel layers 163, and the impurity regions 163a may be formed at the lower portions of the vertical channel layers 163 by the diffused impurities. As described above, the impurity region 163a, which functions as a source of the source selection transistor of the third memory block layer 110BL2, may be formed at the lower portion of the vertical channel layer 163. In addition, electrical characteristics of the entire memory string as well as electrical characteristic of the source selection transistor may be improved.

Subsequently, the third memory block layer 110BL2 may be formed over the entire structure in which the common source line is formed. For example, by the method described above with reference to FIGS. 5 to 12, the vertical channel layers 163, the tunnel insulating layers 161, the charge storage layers 159a, the blocking insulating layers 165 and the local line conductive layers 167 may be formed. Thereafter, the third interlayer insulating layer 169 may be formed.

Thereafter, though not illustrated in FIG. 20, bit lines may be formed over the third memory block layer 110BL2 by the method described above with reference to FIGS. 13 and 14 or FIGS. 16 and 17. In addition, the fourth memory block layer 110BL3 in FIG. 4B may be formed over the bit lines, and a common source line of the fourth memory block layer may be formed over the fourth memory block layer.

Figure 21:
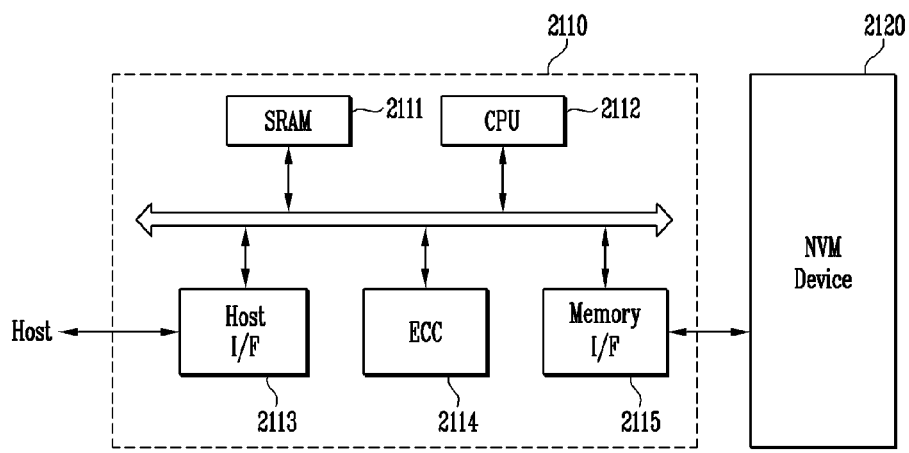
FIG. 21 is a schematic block diagram illustrating a memory system according to an embodiment.

FIG. 21 is a schematic block diagram illustrating a memory system according to an embodiment.

As illustrated in FIG. 21, a memory system 2100 according to an embodiment may include a non-volatile memory device 2120 and a memory controller 2110.

The non-volatile memory device 2120 may include the above-described semiconductor memory. The memory controller 2110 may be suitable for controlling the non-volatile memory device 2120 in a general operation mode such as a program loop, a read operation or an erase loop.

The memory controller 2110 may be a solid state disk (SSD) or a memory card in which the non-volatile memory device 2120 and the memory controller 2110 are combined. SRAM 2111 may function as an operation memory of a processing unit 2112. A host interface 2113 may include a data exchange protocol of a host being coupled to the memory system 2100. An error correction block 2114 may detect and correct errors included in a data read from the non-volatile memory device 2120. A memory interface 2114 may interface with the non-volatile memory device 2120. The processing unit 2112 may perform the general control operation for data exchange of the memory controller 2110.

Though not shown in FIG. 21, the memory system 2100 may further include ROM (not illustrated) that stores code data to interface with the host. In addition, the non-volatile memory device 2120 may be a multi-chip package composed of a plurality of flash memory chips. The memory system 2100 having the above-described configuration may be provided as a storage medium having high reliability and low error rate. When a flash memory device according to an embodiment is provided in a memory system such as a semiconductor disk device (solid state disk (SSD)) on which research has been actively conducted, the memory controller 2110 may communicate with an external device (e.g., a host) through one of various interface protocols, such as USB, MMC, PCI-E, SATA, PATA, SCSI, ESDI and IDE.

Figure 22:
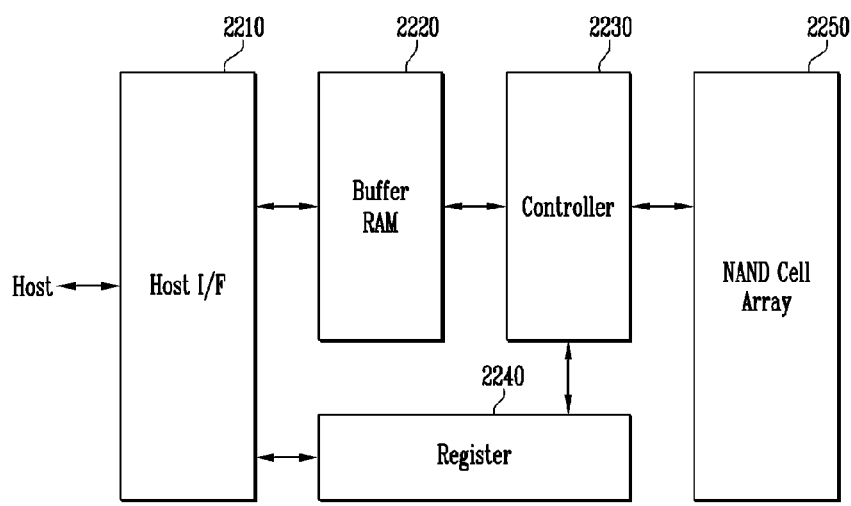
FIG. 22 is a schematic block diagram illustrating a fusion memory device or a fusion memory system performing a program operation according to the earlier described embodiments.

FIG. 22 is a schematic block diagram illustrating a fusion memory device or a fusion memory system performing a program operation according to the earlier described embodiments. For example, technical features of the present disclosure may be applied to a OneNAND flash memory device 2200 as a fusion memory device.

The OneNand flash memory device 2200 may include a host interface (I/F) 2210, a buffer RAM 2220, a controller 2230, a register 2240 and a NAND flash cell array 2250. The host interface 2210 may be suitable for exchanging various types of information with a device using different protocols. The buffer RAM 2220 may be loaded with codes for driving the memory device or temporarily store data. The controller 2230 may be suitable for controlling read and program operations and every state in response to a control signal and a command that are externally given. The register 2240 may be configured to store data including instructions, addresses and configurations defining a system operating environment in the memory device. The NAND flash cell array 2250 may include operating circuits including non-volatile memory cells and page buffers. The memory array illustrated in FIG. 4 may be applied as a memory array of the NAND flash cell array 2250. The NAND flash cell array 2250 may include the above-described semiconductor memory with regards to the above description and/or figures.

Figure 23:
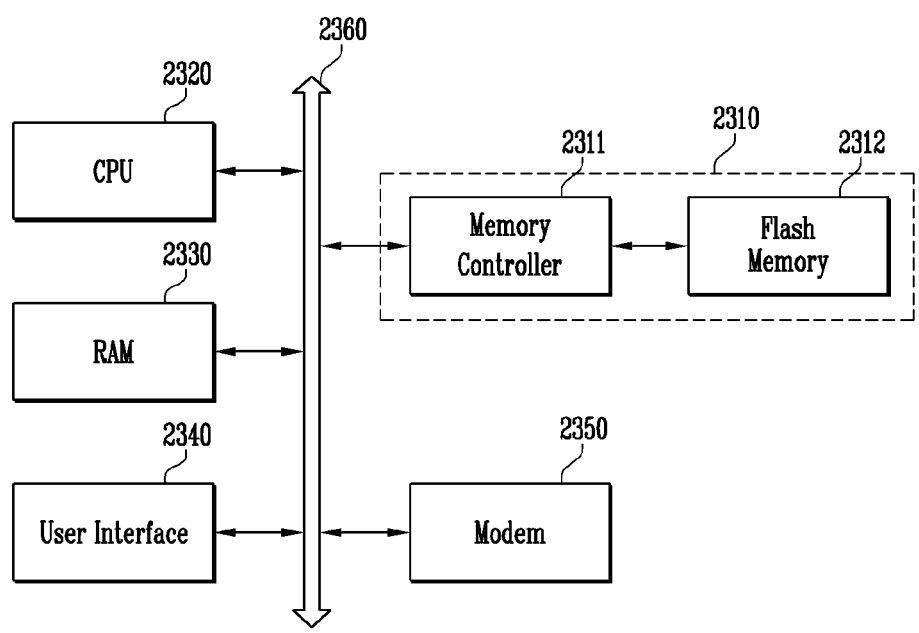
FIG. 23 is a schematic block diagram illustrating a flash memory device according to an embodiment.

FIG. 23 is a schematic view illustrating a computing system including a flash memory device 2312. The flash memory device 2312 may include the above-described semiconductor memory with regards to the above description and/or figures. The memory system 2310 may include a memory controller 2311 and flash memory 2312 as described above with reference to FIG. 21. A computing system 2300 according to an embodiment may include a microprocessor 2320, RAM 2330, a user interface 2340, a modem 2350, such as a baseband chipset, and a memory system 2310 that are electrically coupled to a system bus 2360. In addition, when the computing system 2300 is a mobile device, a battery (not illustrated) may be further included to apply an operating voltage to the computing system 2300. Though not shown in FIG. 23, the computing system 2300 may further include application chipsets, a camera image processor (CIS) and mobile DRAM. The memory system 2310 may form a solid state drive/disk (SSD) that uses a non-volatile memory device in order to store data. Alternatively, the memory system 2310 may be provided as a fusion memory flash memory (e.g., OneNAND flash memory).

According to the present disclosure, electrical characteristics of a memory string may be improved.

Although the present disclosure has been described with reference to certain exemplary embodiments thereof, it will be understood by those skilled in the art that a variety of modifications and variations may be made to the present disclosure without departing from the spirit or scope of the present disclosure defined in the appended claims, and their equivalents.

What is claimed is:

1. A semiconductor device, comprising:
   first memory strings coupled between a first common source line formed on a substrate and bit lines formed over the first common source line; and
   second memory strings coupled between the bit lines and a second common source line formed over the bit lines,
   wherein each of the bit lines includes a stacked structure of a conductive layer and a silicon layer formed over the conductive layer.

2. The semiconductor device of claim 1, wherein the first memory string and the second memory string have vertically and substantially symmetrical shapes.

3. The semiconductor device of claim 1, wherein the conductive layer includes a metal layer, a metal silicide layer, or a stacked structure of the metal layer and the metal silicide layer.

4. The semiconductor device of claim 1, wherein the conductive layer includes a tungsten layer or a copper layer.

5. The semiconductor device of claim 1, wherein the silicon layer includes a polysilicon layer including impurities.

6. The semiconductor device of claim 5, wherein the silicon layer includes 5-valence impurities.

7. The semiconductor device of claim 5, wherein a lower portion of the vertical channel layer, included in the second memory string, contacts the silicon layer, and the impurities are included in the lower portion of the vertical channel layer.

8. The semiconductor device of claim 1, wherein the bit line further includes a barrier metal layer formed between the conductive layer and the silicon layer.

9. The semiconductor device of claim 8, wherein the barrier metal layer includes a titanium layer, a titanium nitride layer, or a stacked structure of the titanium layer and the titanium nitride layer and is formed in a shape of a plug.

10. The semiconductor device of claim 1, wherein the silicon layer of the bit line is formed in a linear shape.

11. The semiconductor device of claim 1, wherein the silicon layer is formed in a shape of a plug and forms an upper part of the bit line at a position corresponding to the second memory strings.

12. A semiconductor device, comprising:
    first memory strings coupled between first bit lines formed over a substrate and a common source line formed over the first bit lines; and
    second memory strings coupled between the common source line and second bit lines formed over the common source line,
    wherein the common source line includes a stacked structure of a conductive layer and a silicon layer formed over the conductive layer.

13. The semiconductor device of claim 12, wherein the first memory string and the second memory string have vertically and substantially symmetrical shapes.

14. The semiconductor device of claim 12, wherein the conductive layer includes a metal layer, a metal silicide layer, or a stacked structure of the metal layer and the metal silicide layer.

15. The semiconductor device of claim 12, wherein the conductive layer includes a tungsten layer or a copper layer.

16. The semiconductor device of claim 12, wherein the silicon layer includes a polysilicon layer including impurities.

17. The semiconductor device of claim 16, wherein the silicon layer includes 5-valence impurities.

18. The semiconductor device of claim 16, wherein a lower portion of the vertical channel layer, included in the second memory string, contacts the silicon layer, and the impurities are included in the lower portion of the vertical channel layer.

19. The semiconductor device of claim 12, wherein the common source line further includes a barrier metal layer formed between the conductive layer and the silicon layer.

20. The semiconductor device of claim 19, wherein the barrier metal layer includes a titanium layer, a titanium nitride layer, or a stacked structure of the titanium layer and the titanium nitride layer and is formed in a shape of a plug.

21. The semiconductor device of claim 12, wherein the silicon layer of the common source line is formed in a linear shape.

22. The semiconductor device of claim 12, wherein the silicon layer is formed in a shape of a plug and forms an upper part of the common source line at a position corresponding to the second memory strings.

* * * * *